United States Patent
Liou et al.

(10) Patent No.: US 11,705,177 B2
(45) Date of Patent: Jul. 18, 2023

(54) SEMICONDUCTOR MEMORY DEVICES AND METHODS OF MANUFACTURING THEREOF

(71) Applicant: Taiwan Semiconductor Manufacturing Company, Ltd., Hsinchu (TW)

(72) Inventors: Peng-Chun Liou, Hsinchu (TW); Zhiqiang Wu, Hsinchu (TW); Chung-Wei Wu, Hsinchu (TW); Yi-Ching Liu, Hsinchu (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/470,854

(22) Filed: Sep. 9, 2021

(65) Prior Publication Data
US 2022/0293158 A1    Sep. 15, 2022

Related U.S. Application Data

(60) Provisional application No. 63/160,028, filed on Mar. 12, 2021.

(51) Int. Cl.
*G11C 11/22* (2006.01)
*H10B 51/20* (2023.01)

(52) U.S. Cl.
CPC ...... *G11C 11/2257* (2013.01); *G11C 11/2255* (2013.01); *G11C 11/2297* (2013.01); *H10B 51/20* (2023.02)

(58) Field of Classification Search
CPC ............ G11C 11/2257; G11C 11/2255; G11C 11/2297; H01L 27/11597
USPC ....................................... 365/185.05, 185.24
See application file for complete search history.

(56) References Cited

U.S. PATENT DOCUMENTS

| 6,677,831 | B1 * | 1/2004 | Cheng ................ H05K 1/025 333/236 |
| 10,825,526 | B1 * | 11/2020 | Li .......................... G11C 16/24 |
| 2002/0057137 | A1 * | 5/2002 | Marketkar ............. H01P 5/185 333/24 R |
| 2003/0194889 | A1 * | 10/2003 | Golat .................... H01R 12/73 439/79 |

(Continued)

FOREIGN PATENT DOCUMENTS

| CN | 104835910 A * | 8/2015 | ......... H01L 27/2436 |
| WO | WO-2006134732 A1 * | 12/2006 | ............. G11C 13/00 |

*Primary Examiner* — Michael T Tran
(74) *Attorney, Agent, or Firm* — Foley & Lardner LLP

(57) ABSTRACT

A semiconductor device comprises a first conductive structure extending along a vertical direction and a second conductive structure extending along the vertical direction. The second conductive structure is spaced apart from the first conductive structure along a lateral direction. The semiconductor device further comprises a plurality of third conductive structures each extending along the lateral direction. The plurality of third conductive structures are disposed across the first and second conductive structures. The first and second conductive structures each have a varying width along the lateral direction. The plurality of third conductive structures are configured to be applied with respective different voltages in accordance with the varying width of the first and second conductive structures.

20 Claims, 37 Drawing Sheets

(56) References Cited

U.S. PATENT DOCUMENTS

| | | | | |
|---|---|---|---|---|
| 2006/0087379 | A1* | 4/2006 | Bartley | H01P 5/02 |
| | | | | 333/34 |
| 2009/0284324 | A1* | 11/2009 | Van Quach | H05K 1/0237 |
| | | | | 333/34 |
| 2010/0214041 | A1* | 8/2010 | Cho | H01P 5/185 |
| | | | | 29/846 |
| 2011/0317482 | A1* | 12/2011 | Pyeon | G11C 13/0069 |
| | | | | 365/163 |
| 2014/0103434 | A1* | 4/2014 | Lu | H01L 29/78 |
| | | | | 716/120 |
| 2015/0023087 | A1* | 1/2015 | Takahashi | G11C 5/06 |
| | | | | 365/72 |
| 2015/0187418 | A1* | 7/2015 | Tsai | H01L 27/101 |
| | | | | 365/63 |
| 2015/0243886 | A1* | 8/2015 | Narayanan | H01L 45/085 |
| | | | | 257/3 |
| 2016/0035420 | A1* | 2/2016 | Konno | G11C 13/0028 |
| | | | | 365/51 |
| 2017/0256835 | A1* | 9/2017 | Mei | H01P 1/24 |
| 2018/0233206 | A1* | 8/2018 | Yu | G11C 16/0483 |
| 2018/0308546 | A1* | 10/2018 | Tomita | G11C 13/0069 |
| 2019/0123276 | A1* | 4/2019 | Ratnam | G11C 13/0009 |
| 2019/0341297 | A1* | 11/2019 | Lilak | H01L 29/66545 |
| 2020/0295002 | A1* | 9/2020 | Snyder | H01L 29/78696 |
| 2020/0411543 | A1* | 12/2020 | Wang | H01L 29/40117 |
| 2021/0034304 | A1* | 2/2021 | Senoo | G06F 12/0895 |
| 2021/0057019 | A1* | 2/2021 | Oh | G11C 11/4094 |
| 2021/0066291 | A1* | 3/2021 | Lin | H01L 29/785 |
| 2021/0125660 | A1* | 4/2021 | Maejima | G11C 11/4097 |
| 2021/0166736 | A1* | 6/2021 | Vimercati | G11C 11/1657 |
| 2021/0210551 | A1* | 7/2021 | Han | H01L 45/147 |
| 2021/0366906 | A1* | 11/2021 | Huang | H01L 21/823878 |
| 2022/0157710 | A1* | 5/2022 | Li | H01L 21/76831 |

* cited by examiner

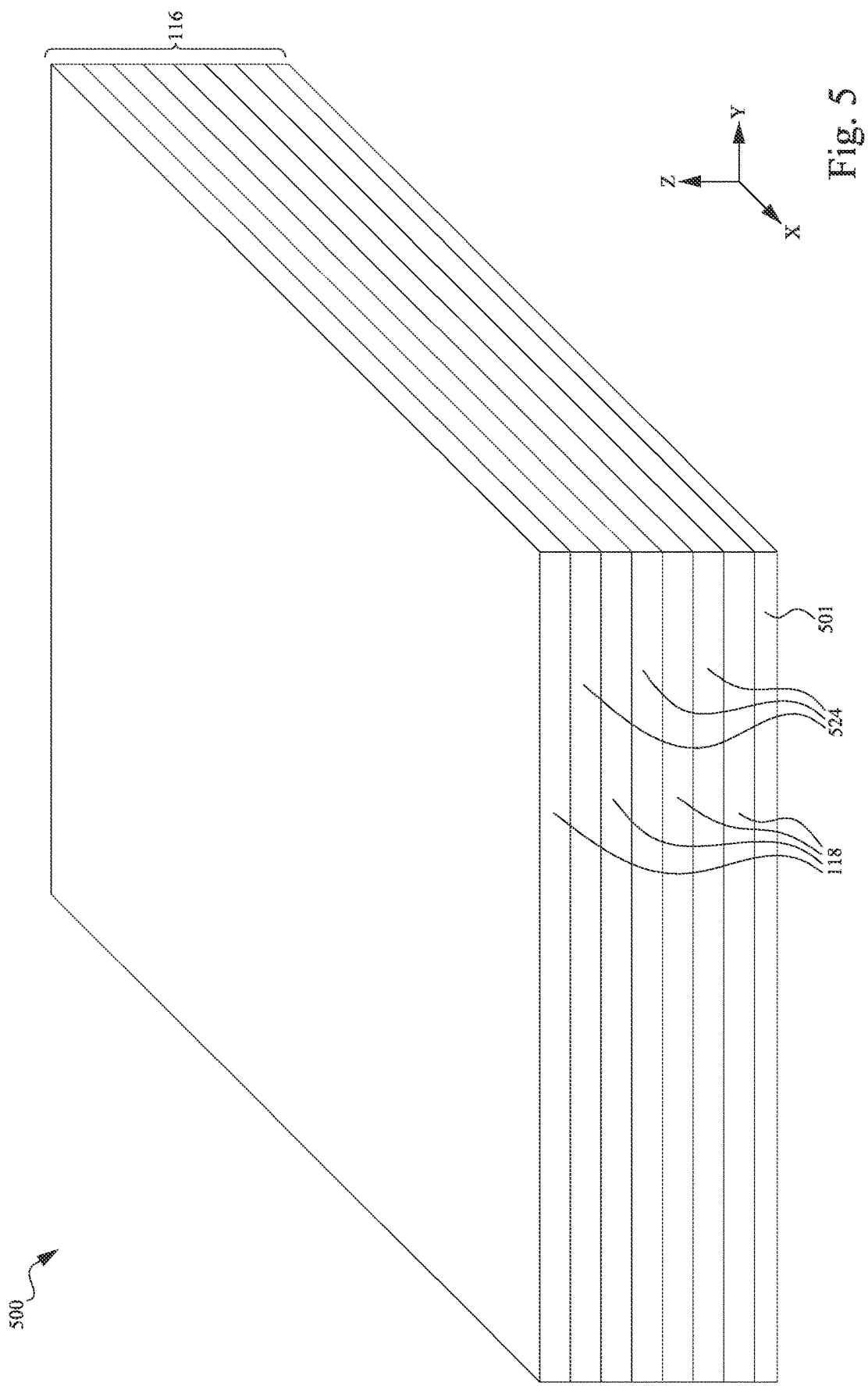

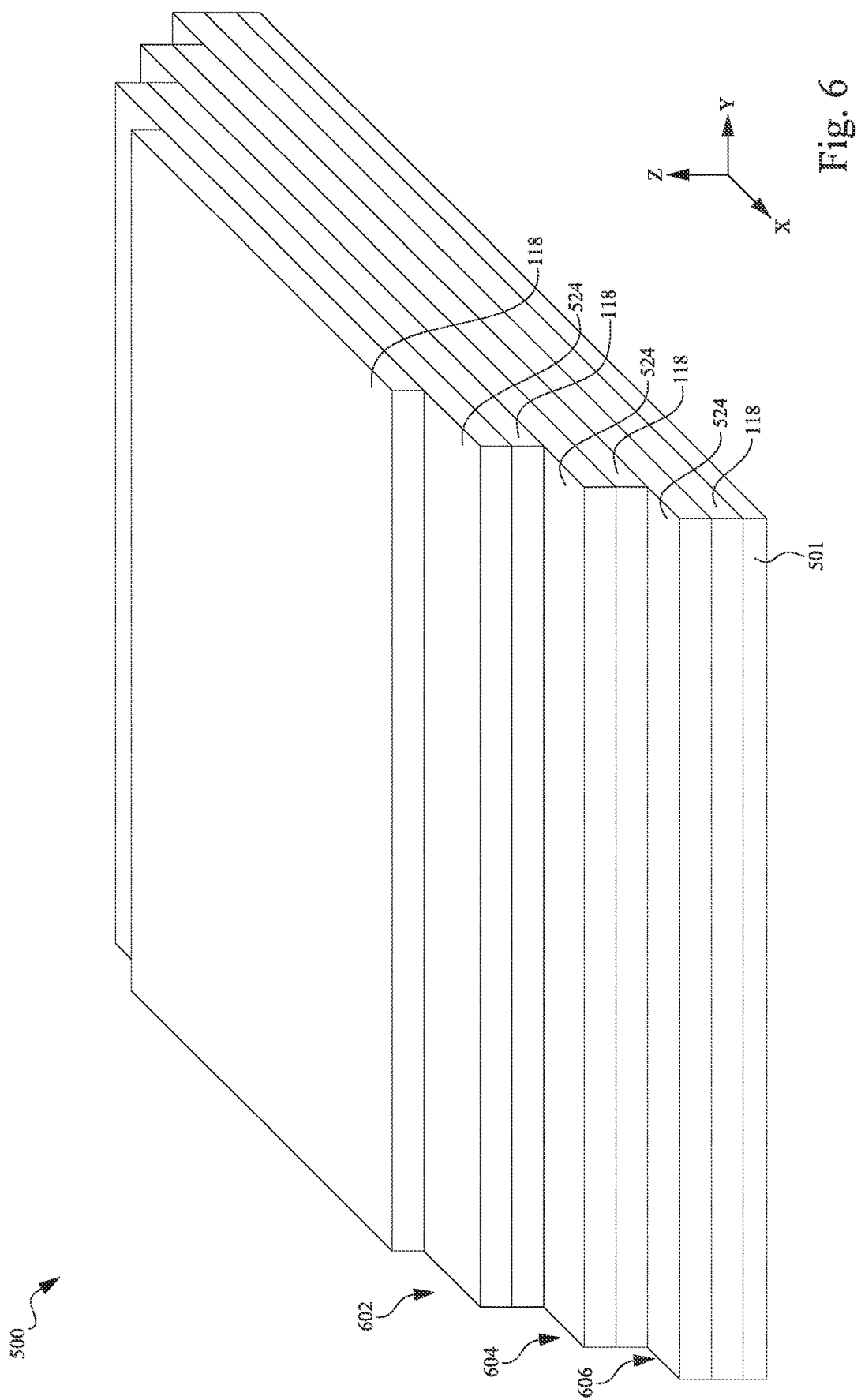

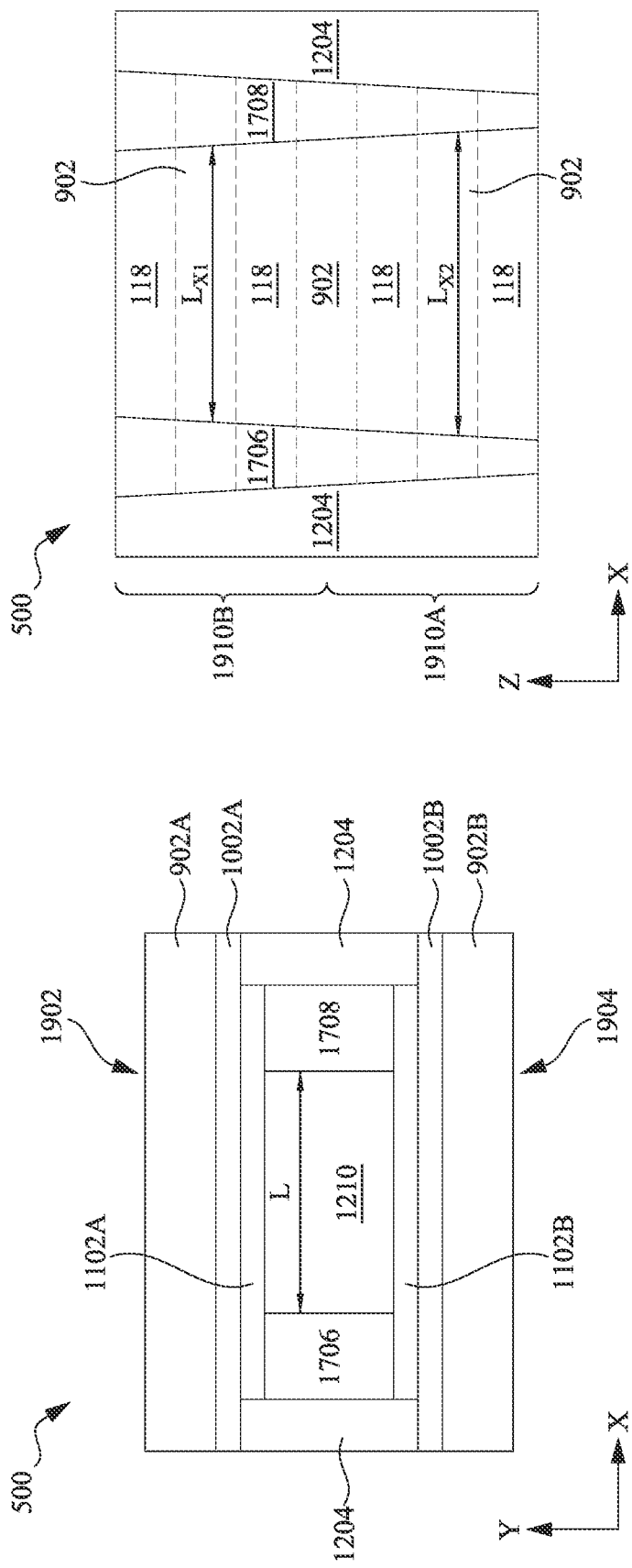

SEMICONDUCTOR MEMORY DEVICES AND METHODS OF MANUFACTURING THEREOF

CROSS-REFERENCE TO RELATED APPLICATION

This application claims priority to and the benefit of U.S. Provisional Application No. 63/160,028, filed Mar. 12, 2021, entitled "3D MEMORY DEVICE WITH LAYER-DEPENDENT WORD LINE READ-BIAS," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5, 6, 7, 8, 9, 10, 11, 12, 13, 14, 15, 16, 17, and 18 illustrate perspective views of an example semiconductor device (or a portion of the example semiconductor device) during various fabrication stages, made by the method of FIGS. 4A-C, in accordance with some embodiments.

FIGS. 19A-B illustrate a top view and a cross-sectional view cut along a first lateral cross-section (e.g., along the X-direction), respectively, of the example semiconductor device, in accordance with some embodiments.

DETAILED DESCRIPTION

Figure 1:
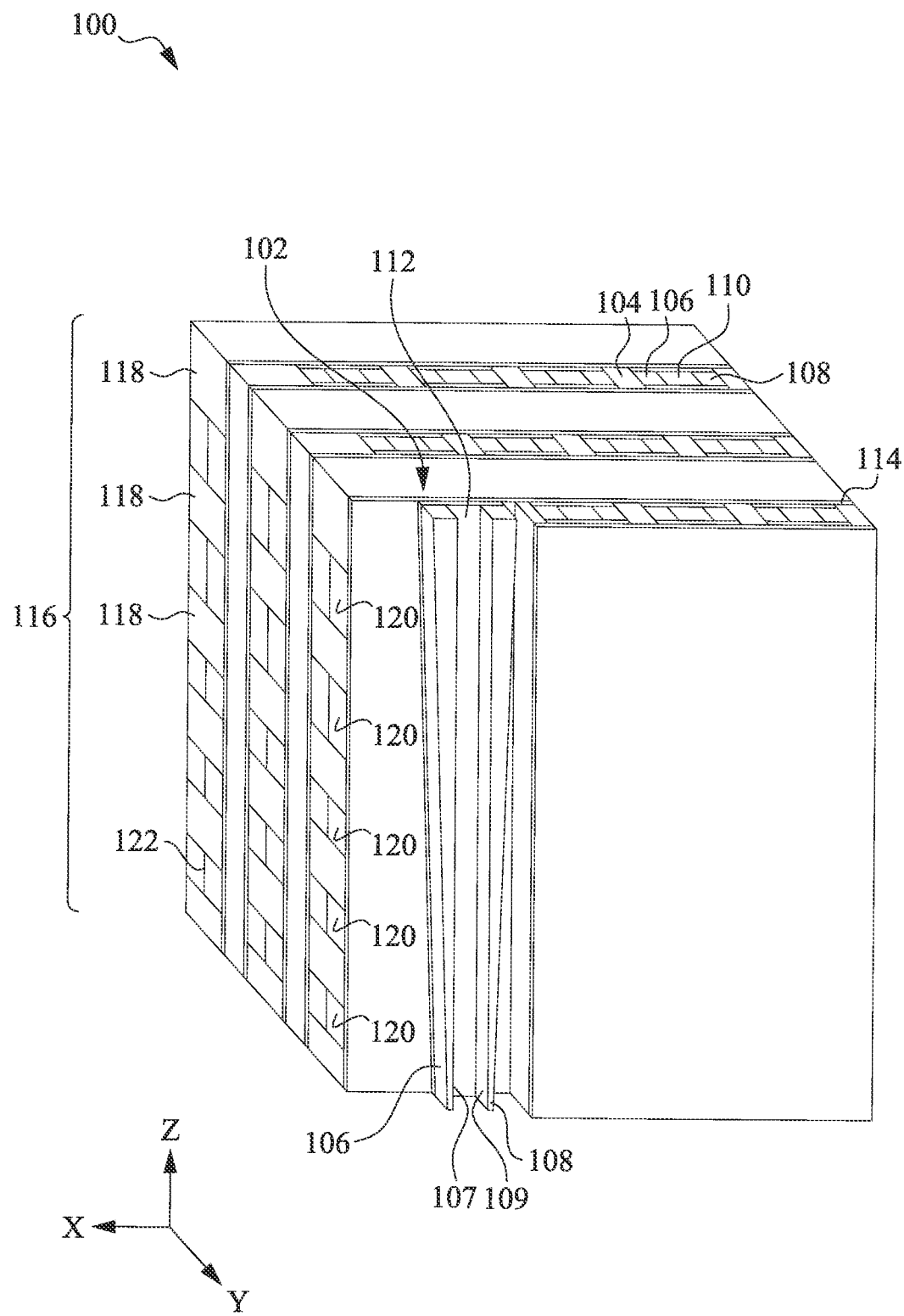
FIG. 1 is a perspective view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a 3D memory device (sometimes referred to as a semiconductor device) includes a number of memory blocks. Each memory block includes at least one memory array (or sub-array) of memory cells formed in a stack of insulating layers and conductive layers. The array of memory devices are formed in a stack of insulating layers and gate layers and may include a plurality of gate layers. The memory cells are formed across multiple memory levels (or tiers) over a substrate. For example, each memory cell can be constituted by at least one of: a portion of a semiconductor channel layer that continuously extends along a vertical direction of the array, a portion of a memory film that continuously extends along the vertical direction, a first conductive structure (functioning as a drain electrode) that continuously extends along the vertical direction, a second conductive structure (functioning as a source electrode) that continuously extends along the vertical direction, and one of a plurality of third conductive structures (functioning as gate layers or gate electrodes) that continuously extend along a first lateral direction of the array. The drain electrode, source electrode, and gate layers may sometimes be referred to as "bit line (BL)," "source/select line (SL), and "word line (WL)," respectively.

In some cases, the memory block further includes an interface portion formed on either or both sides of the memory array to allow electrical connection to the memory cells included in the array. For example, the WLs may extend from the array (which is sometimes referred to as a device portion) and further along the interface portion(s). The WLs can have a staircase profile in the interface portion. A number of WL staircase vias, electrically and physically coupled to respective WLs, are generally formed in the interface portions. Further, the WL staircase vias are electrically and physically coupled through metal routings to a number of WL vias. As will be discussed below, a controller (e.g., a memory core control circuit) can provide suitable (e.g., voltage) levels of bias for different WLs, through such interconnect structures in the interface portion.

In some cases, the memory array can include a certain number of memory levels (e.g., about 16 memory levels), which causes the BLs/SLs to have a relatively high aspect ratio or ratio of the height to the weight. With such a high aspect ratio, the BLs and SLs can be formed as having a tapered profile. Generally, the channel length of a memory cell is defined as the length of a portion of a semiconductor channel that is interposed between the BL and SL. Alternatively stated, the channel length may correspond to the distance separating respective (inner) sidewalls of the BL and the SL along a lateral direction. Because of the tapered profile of the BL and SL, the respective channel lengths of memory cells arranged along a vertical direction (which are sometimes referred to as a memory string) can vary. For example, when the BL and SL are formed to have a wider upper portion and a narrower lower portion, the channel length of a memory cell disposed at a lower level may be longer than the channel length of a memory cell disposed at a higher level. Such non-uniform (or otherwise varying) channel lengths can disadvantageously impact overall performance of the memory array. As the current level of each memory cell is generally proportional to its channel length, the varying channel lengths result in varying levels of cell current. For example, a longer (or longer than expected) channel length can lead to an undesired, insufficient cell current level, while a shorter (or shorter than expected) channel length can lead to an undesired, overwhelming cell current level.

Embodiments of the present disclosure are discussed in the context of forming a semiconductor device, and particularly in the context of forming a 3D memory device, that can compensate for varying cell currents. In accordance with various embodiments, even with the tapered profile of the BL and SL being formed which causes a varying channel length, the 3D memory device, as disclosed herein, includes a plurality of WLs that are provided with different levels of bias by a controller to compensate for the varying cell current. For example, the cell current of a longer channel length can be compensated through applying, by the controller, a higher (e.g., voltage) level of bias, which can compensate for the lower cell current. On the other hand, the controller can apply a lower (e.g. voltage) level of bias to word lines with shorter channel lengths, which can compensate for the higher cell current. As such, the current levels of a number of memory cells (e.g., the memory cells of a memory string) can be adjusted to be uniform. Alternatively or additionally, by controlling the level of bias to vary in the direction where memory cells of a memory string are (e.g., vertically) arranged, current levels of those memory cells can be accordingly modulated, as desired, which will be discussed in further detail below.

FIG. 1 illustrates a perspective view of a semiconductor device 100, in accordance to some embodiments. In some embodiments, the semiconductor device 100 depicts the device portion of a memory block. The semiconductor device 100 includes an array of memory cells 102. The semiconductor device may be disposed on a substrate (e.g., a silicon, or silicon on insulator (SOI) substrate) (not shown). When viewed from the top, such an array may be arranged in a column-row configuration, e.g., having a number of rows extending along a first lateral direction (e.g., the X-direction) and a number of columns extending along a second lateral direction (e.g., the Y-direction). Within each row, a number of memory cells 102 can be separated and electrically isolated from one another by an isolation structure 104. Each memory cell 102 can include a source line (SL) 106 and a bit line (BL) 108 separated and electrically isolated from each other by an inner spacer 110.

The semiconductor device 100 can include one or more semiconductor channels 112. The semiconductor channel 112, extending along the vertical direction (e.g., the Z-direction), can be disposed along each of the opposite surfaces (or sidewalls) of the SL 106 and BL 108 in the Y-direction, which may be better seen in the cut-out portion of FIG. 1. Each semiconductor channel 112 can extend in the first lateral direction (e.g., the X-direction), with itself physically separated or electrically isolated from another semiconductor channel 112 within the row (along the X-direction).

The semiconductor device 100 can include one or more memory films 114. The memory film 114, extending along the vertical direction (e.g., the Z-direction), can be disposed along a surface (or sidewall) of each semiconductor channel 112 opposite from the SL 106 and BL 108 in the Y-direction. The memory film 114 can extend in the first lateral direction (e.g., the X-direction).

In some embodiments, a number of memory cells 102 can be defined in the semiconductor device 100. A memory cell 102 can be constituted by a BL, a SL, a portion of a semiconductor channel, a portion of a memory film, and a word line (WL) (which will be discussed below). In the configuration of example FIG. 1, within one of the rows of the array, a number of memory cells 102 can be formed on the opposite sides of each pair of the BL and SL. For example, a first memory cell 102 can be partially defined by a portion of a memory film 114 and a portion of a semiconductor channel 112 disposed on one side of each pair of SL 106 and BL 108, and a second memory cell 102 can be partially defined by a portion of a memory fill 114 and a portion of a semiconductor channel 112 disposed on the other side of that pair of SL 106 and BL 108. Alternatively stated, these two memory cells 102 may share one pair of BL and SL. Further, each row can extend along the vertical direction (e.g., the Z-direction) to include an additional number of memory cells, thereby forming a number of memory strings. It should be understood that the semiconductor device 100 shown in FIG. 1 is merely an illustrative example, and thus, the semiconductor device 100 can be formed in any of various other 3D configurations, while remaining within the scope of present disclosure.

The semiconductor device 100 also includes a plurality of WLs 120 and a plurality of insulating layers 118 alternatively stacked on top of one another in the vertical direction (e.g., the Z-direction) which form a stack 116 disposed on outer surfaces of the memory film 114 (along the Y-direction), such that the stack 116 can be interposed between adjacent rows of memory cells 102. In some embodiments, a topmost layer and a bottommost layer of the stack 116 may include an insulating layer 118 of the plurality of insulating layers 118. The bottommost insulating layer 118 may be disposed on the substrate.

Each of the plurality of WLs 120 extends in semiconductor device 100 along the respective row of memory cells 102 along the first lateral direction (e.g. the X-direction). The insulating layers 118 may also extend along the first lateral direction (e.g., the X-direction). Two parallel WLs 120 may be located adjacent to each other in a second lateral direction that is perpendicular to the first lateral direction and in the same plane (e.g., the Y-direction), and may be interposed between two vertically separated insulating layers 118. In some embodiments, an adhesive layer 122 may be interposed between the WLs 120 and the adjacent insulating layers 118, and facilitate adhesion of the WL 120 to the insulating layer 118, and may also serve as a spacer between two parallel WLs 120 that are interposed between the same vertically separated insulating layers 118. In some embodiments, the adhesive layer 122 is optional.

As a representative example in FIG. 1, one of a number memory cells 102 can be defined by the SL 106, the BL 108, a portion of the semiconductor channel 112, a portion of the memory film 114, and one of the WLs 120. The SL 106 has an inner sidewall 107 and the BL 108 has an inner sidewall 109, a distance of which can define the channel length of such a memory cell. When the SL and the BL are formed in a tapered profile, as shown in FIG. 1, respective channel lengths of the memory cells arranged in the Z-direction (a vertical direction) may vary. In some embodiments, by controlling (e.g., voltage) levels applied to the WLs 120 operatively coupled to those vertically arranged memory cells to vary, the varying channel lengths of those memory cells can be compensated for more controllable overall performance of the semiconductor device 100.

Figure 2A:
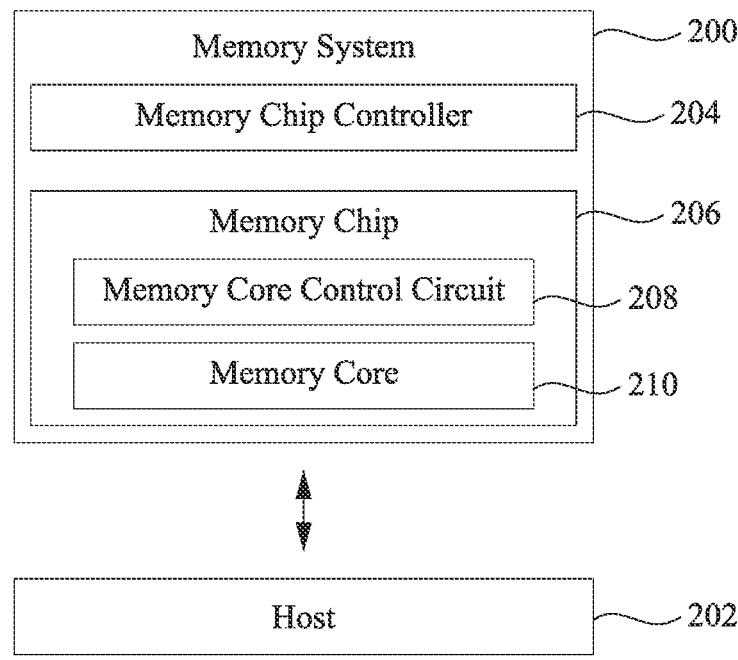
FIG. 2A illustrates a block diagram of a memory system and a host, in accordance with some embodiments.

FIG. 2A illustrates a block diagram including a memory system 200 and a host 202, in accordance with various embodiments. As will be discussed below, the memory system 200 can include one or more above-discussed semiconductor devices 100. The memory system 200 may include a non-volatile storage system interfacing with the host 202 (e.g., a mobile computing device). In some embodiments, the memory system 200 may be embedded within the host 202. In some embodiments, the memory system 200 may include a memory card. As shown, the memory system 200 includes a memory chip controller 204 and a memory chip 206. Although a single memory chip 206 is shown, the memory system 200 may include more than one memory chip (e.g., four, eight or some other number of memory chips). The memory chip controller 204 can receive data and commands from the host 202 and provide memory chip data to the host 202.

The memory chip controller 204 may include one or more state machines, page registers, SRAM, and control circuitry for controlling the operation of the memory chip 206. The one or more state machines, page registers, static random access memory (SRAM), and control circuitry for controlling the operation of the memory chip 206 may be referred to as managing or control circuits. The managing or control circuits may facilitate one or more memory array operations, such as forming, erasing, programming, and reading operations.

In some embodiments, the managing or control circuits (or a portion of the managing or control circuits) for facilitating one or more memory array operations may be integrated within the memory chip 206. The memory chip controller 204 and memory chip 206 may be arranged on a single integrated circuit. In other embodiments, the memory chip controller 204 and memory chip 206 may be arranged on different integrated circuits. In some cases, the memory chip controller 204 and memory chip 206 may be integrated on a system board, logic board, or a printed circuit board (PCB).

The memory chip 206 includes memory core control circuit 208 and a memory core 210. In various embodiments, the memory core control circuit 208 may include logic for controlling the selection of memory blocks (or arrays) within the memory core 210 such as, for example, controlling the generation of voltage references for biasing a particular memory array into a read or write state, generating row and column addresses, applying respective voltage levels of biases on different memory cells that have different channel lengths, which will be discussed in further detail below.

The memory core 210 may include one or more two-dimensional arrays of non-volatile memory cells or one or more three-dimensional arrays of non-volatile memory cells. In an embodiment, the memory core control circuit 208 and memory core 210 are arranged on a single integrated circuit. In other embodiments, the memory core control circuit 208 (or a portion of the memory core control circuit 208) and memory core 210 may be arranged on different integrated circuits.

An example memory operation may be initiated when the host 202 sends instructions to the memory chip controller 204 indicating that the host 202 would like to read data from the memory system 200 or write data to the memory system 200. In the event of a write (or programming) operation, the host 202 will send to the memory chip controller 204 both a write command and the data to be written. The data to be written may be buffered by the memory chip controller 204 and error correcting code (ECC) data may be generated corresponding with the data to be written. The ECC data, which allows data errors that occur during transmission or storage to be detected and/or corrected, may be written to the memory core 210 or stored in non-volatile memory within the memory chip controller 204. In an embodiment, the ECC data are generated and data errors are corrected by circuitry within the memory chip controller 204.

The memory chip controller 204 can control operation of the memory chip 206. In one example, before issuing a write operation to the memory chip 206, the memory chip controller 204 may check a status register to make sure that the memory chip 206 is able to accept the data to be written. In another example, before issuing a read operation to the memory chip 206, the memory chip controller 204 may pre-read overhead information associated with the data to be read. The overhead information may include ECC data associated with the data to be read or a redirection pointer to a new memory location within the memory chip 206 in which to read the data requested. Once a read or write operation is initiated by the memory chip controller 204, the memory core control circuit 208 may, for example, generate the appropriate levels of biases for word lines (WLs) and bit lines (BLs) within the memory core 210, and generate the appropriate memory block, row, and column addresses.

Figure 2B:
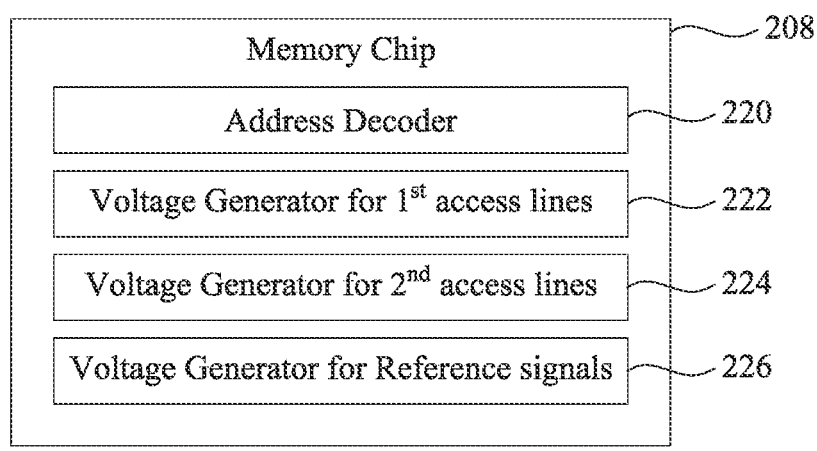
FIG. 2B illustrates a block diagram of a memory core control circuit, in accordance with some embodiments.

FIG. 2B illustrates one example block diagram of the memory core control circuit 208, in accordance with various embodiments. As shown, the memory core control circuit 208 includes an address decoder 220, a voltage generator for first access lines 222, a voltage generator for second access lines 224, and a signal generator for reference signals 226. In some embodiments, access lines may include word lines (WLs), bit lines (BLs), source/select lines (SLs), or combinations thereof. First access lines may include selected WLs, selected BLs, and/or selected SLs that are used to place non-volatile memory cells into a selected state. Second access lines may include unselected WLs, unselected BLs, and/or unselected SLs that are used to place non-volatile memory cells into an unselected state.

In accordance with various embodiments, the address decoder 220 can generate memory block addresses, as well as row addresses and column addresses for a particular memory block. The voltage generator (or voltage regulators) for first access lines 222 can include one or more voltage generators for generating first (e.g., selected) access line voltages. The voltage generator for second access lines 224 can include one or more voltage generators for generating second (e.g., unselected) access line voltages. The signal generators for reference signals 226 can include one or more voltage and/or current generators for generating reference voltage and/or current signals.

Figure 2C:
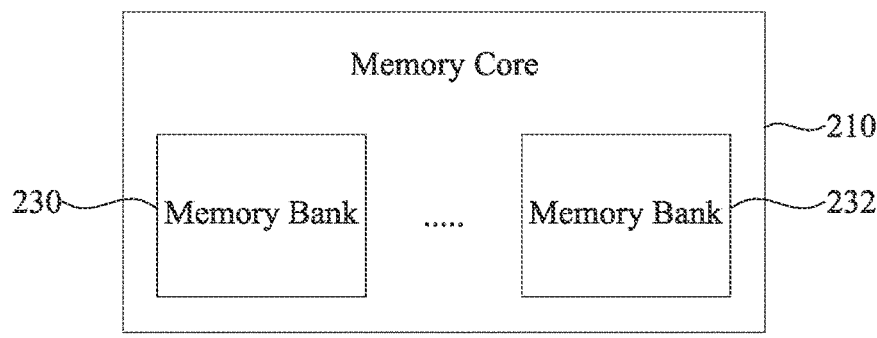
FIG. 2C illustrates a block diagram of a memory core, in accordance with some embodiments.
Figure 2D:
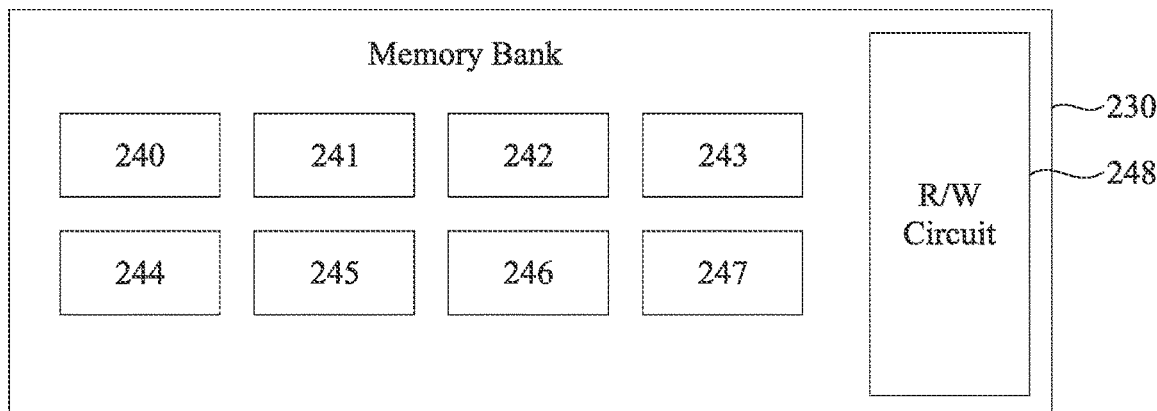
FIG. 2D illustrates a block diagram of a memory bank, in accordance with some embodiments.
Figure 2E:
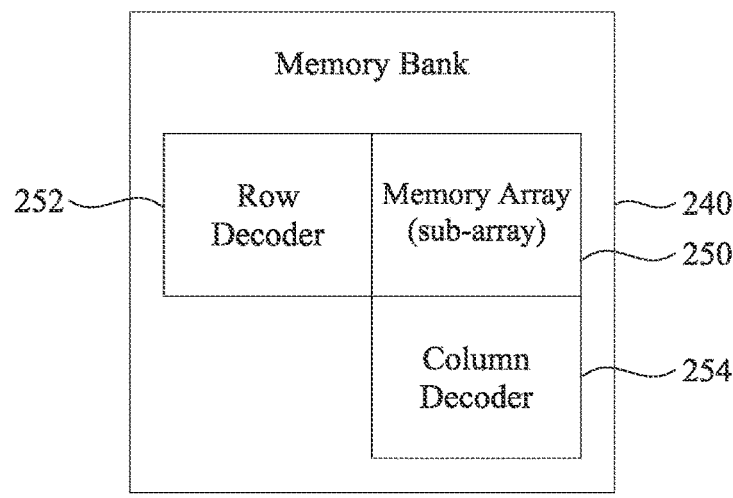
FIG. 2E illustrates a block diagram of a memory block, in accordance with some embodiments.

FIGS. 2C-2E illustrate an example organization of the memory core 210, in accordance with various embodiments. The memory core 210 includes a number of memory banks, and each memory bank includes a number of memory blocks. Although an example memory core organization is disclosed where memory banks each include memory blocks, and memory blocks each include a group of non-volatile memory cells (arranged as a memory array or sub-array), other organizations or groupings also can be used, while remaining within the scope of the present disclosure.

FIG. 2C illustrates an example block diagram of the memory core 210, in accordance with various embodiments. As shown, the memory core 210 includes memory banks 230, 232, etc. It should be appreciated the memory core 200 can include any number of memory banks, while remaining within the scope of the present disclosure. For example, a memory core may include only a single memory bank or multiple memory banks (e.g., 16 or other number of memory banks).

FIG. 2D illustrates an example block diagram of one of the memory banks (e.g., 230 shown in FIG. 2C), in accordance with various embodiments. As shown, the memory bank 230 includes memory blocks 240, 241, 242, 243, 244, 245, 246, and 247, and a read/write circuit 248. It should be appreciated the memory bank 230 can include any number of memory blocks, while remaining within the scope of the present disclosure. For example, a memory bank may include one or more memory blocks (e.g., 32 or other number of memory blocks per memory bank). The read/write circuit 248 can include circuitry for reading and writing memory cells within the memory blocks 240-247.

In some embodiments, the read/write circuit 248 may be shared across multiple memory blocks within a memory bank. This allows chip area to be reduced because a single group of read/write circuit 248 may be used to support multiple memory blocks. However, in some embodiments, only a single memory block may be electrically coupled to the read/write circuit 248 at a particular time to avoid signal conflicts. In some embodiments, the read/write circuit 248 may be used to write one or more pages of data into the memory blocks 240-247 (or into a subset of the memory blocks). The non-volatile memory cells within the memory blocks 240-247 may permit direct over-writing of pages (i.e., data representing a page or a portion of a page may be written into the memory blocks 240-247 without requiring an erase or reset operation to be performed on the non-volatile memory cells prior to writing the data).

In some cases, the read/write circuit 248 may be used to program a particular non-volatile memory cell to be in one of multiple (e.g., 2, 3, etc.) data states. For example, the particular non-volatile memory cell may include a single-level or multi-level non-volatile memory cell. In one example, the read/write circuits 248 may apply a first voltage difference (e.g., 2V) across the particular non-volatile memory cell to program the particular non-volatile memory cell into a first state of the multiple data states or a second voltage difference (e.g., 1V) across the particular non-volatile memory cell that is less than the first voltage difference to program the particular non-volatile memory cell into a second state of the multiple data states.

FIG. 2E illustrates an example block diagram of one of the memory blocks (e.g., 240) of the memory bank 230 of FIG. 2D, in accordance with various embodiments. As shown, the memory block 240 includes a memory array (or sometimes referred to as a memory sub-array) 250, a row decoder 252, and a column decoder 254. As disclosed herein, the memory array 250 may be implemented as the semiconductor device 100, as shown in FIG. 1. For example, such a memory array 250 includes a contiguous group of non-volatile memory cells, each of which can be accessed through a respective combination of access lines (e.g., a combination of one of contiguous WLs, one of contiguous BLs, and one of contiguous SLs). Such access lines may sometimes be referred to as an interface portion of the memory block, in some embodiments. The memory array 250 may include one or more layers of non-volatile memory cells. The memory array 250 may include a two-dimensional memory array and/or a three-dimensional memory array. The device portion may be formed within the memory array 250, which will be shown and discussed in further detail below.

The row decoder 252 can decode a row address and select a particular WL, when appropriate (e.g., when reading or writing non-volatile memory cells in the memory array 250). The column decoder 254 can decode a column address and select one or more BLs/SLs in the memory array 250 to be electrically coupled to read/write circuits, such as the read/write circuit 248 in FIG. 2D. As a non-limiting example, the number of WLs is in the range of 4K per memory layer, the number of BLs/SLs is in the range of 1K per memory layer, and the number of memory layers is 4, which renders about 16M non-volatile memory cells contained in the memory array 250 (of the memory block 240).

Figure 3:
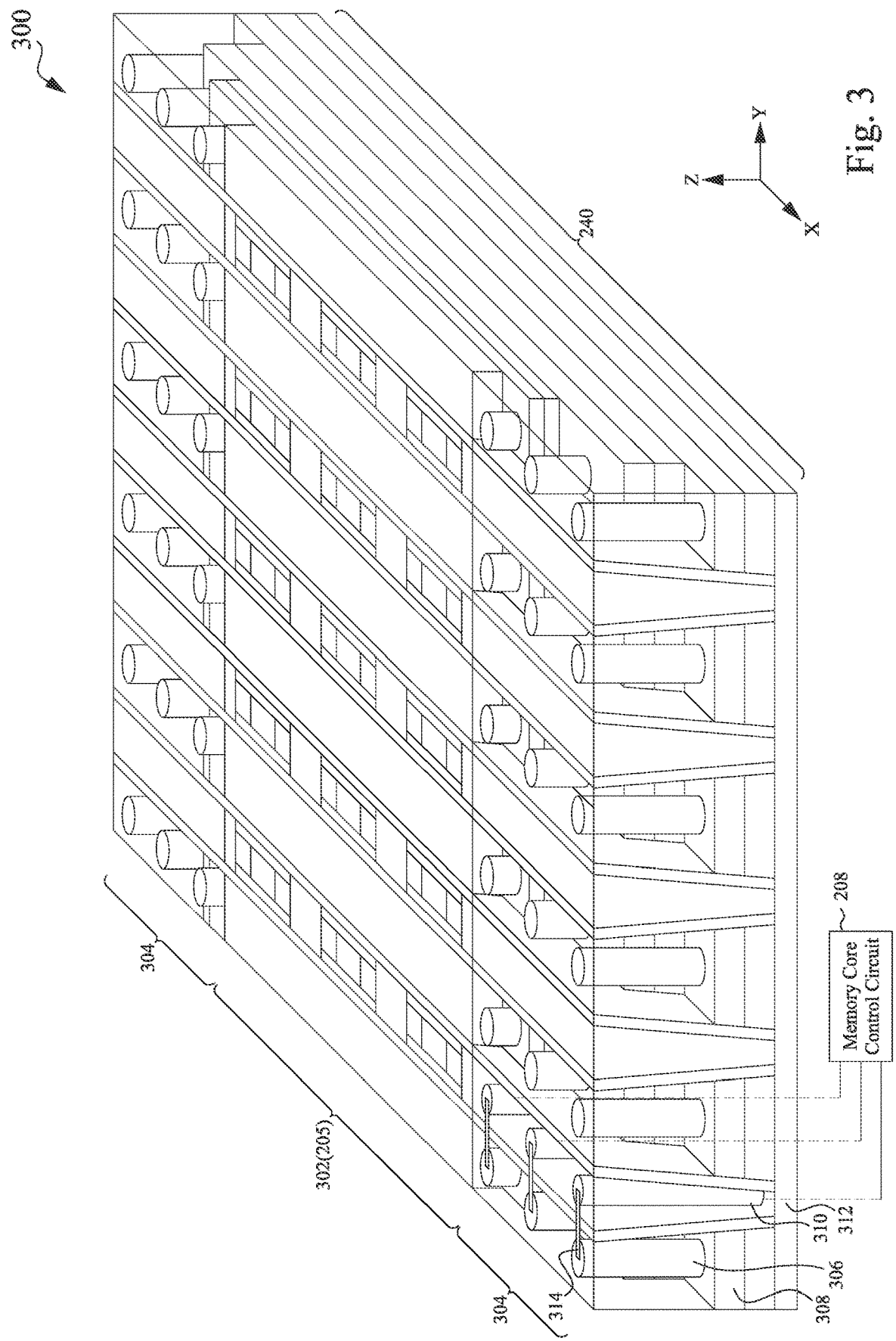
FIG. 3 illustrates a perspective view of a memory block, in accordance with some embodiments.

FIG. 3 illustrates a perspective view of an example portion of the memory block 240, according to various embodiments of the present disclosure. In the following discussions, the memory block 240 (sometimes referred to as a semiconductor device or a memory device) is selected as a representative example. It should be understood that other memory blocks (of the memory bank 230 of FIG. 2D) are substantially similar to the memory block 240, and thus, the discussions are not repeated. Further, the perspective view of FIG. 3 is simplified, and thus, it should be understood that any of various other features/components can also be included in FIG. 3, while remaining within the scope of the present disclosure.

As shown, the memory block 240 includes a device portion 302. The device portion 302 in FIG. 3 can be a portion of the memory array 250 (FIG. 2E), which may be implemented as the semiconductor device 100 shown in FIG. 1. Hereinafter, the device portion 302 may sometimes be referred to as "memory array 302." The memory array 302 includes a number of memory cells formed across a number of memory layers (e.g., 3 memory layers as shown)

stacked on top of one another along a vertical direction, e.g., the Z direction. In addition, the memory block 240 includes a number of interface portions 304 located next to the device portion 302, which allows each memory cell of the memory array 302 to be accessed (or otherwise controlled). The interface portions 304 each have a staircase or step profile in the Z-direction, as described later in further detail herein.

To electrically access the memory array 302 through the interface portion 304, the memory block 240 further includes a number of first interconnect structures 306 (e.g., via structures or WL staircase vias) extending along the Z-direction that land on respective stairs of a number of word lines 308 of the interface portion 304. In some embodiments, the memory block 240 also includes a number of second interconnect structures 310 (sometimes referred to as WL vias) extending along the Z-direction that may be electrically coupled to the memory core control circuit 208 configured to apply a varying bias to each word line. In some embodiments, each WL via 310 is electrically coupled to a corresponding WL staircase via 306 through a metal routing 314. For the purposes of clarity, three groups of WL staircase 306, WL via 310, and metal routing 314, coupled to three stairs of WLs 308 along a certain row of the memory block 240, are shown, but it should be understood that the memory block 240 can include a greater number of such groups that are coupled to the stairs of WLs along other row. According to some embodiments, a controller (e.g., memory core control circuit 208) can apply suitable voltage levels of bias to the different WLs 308 through such interconnect structures.

Figure 4A:
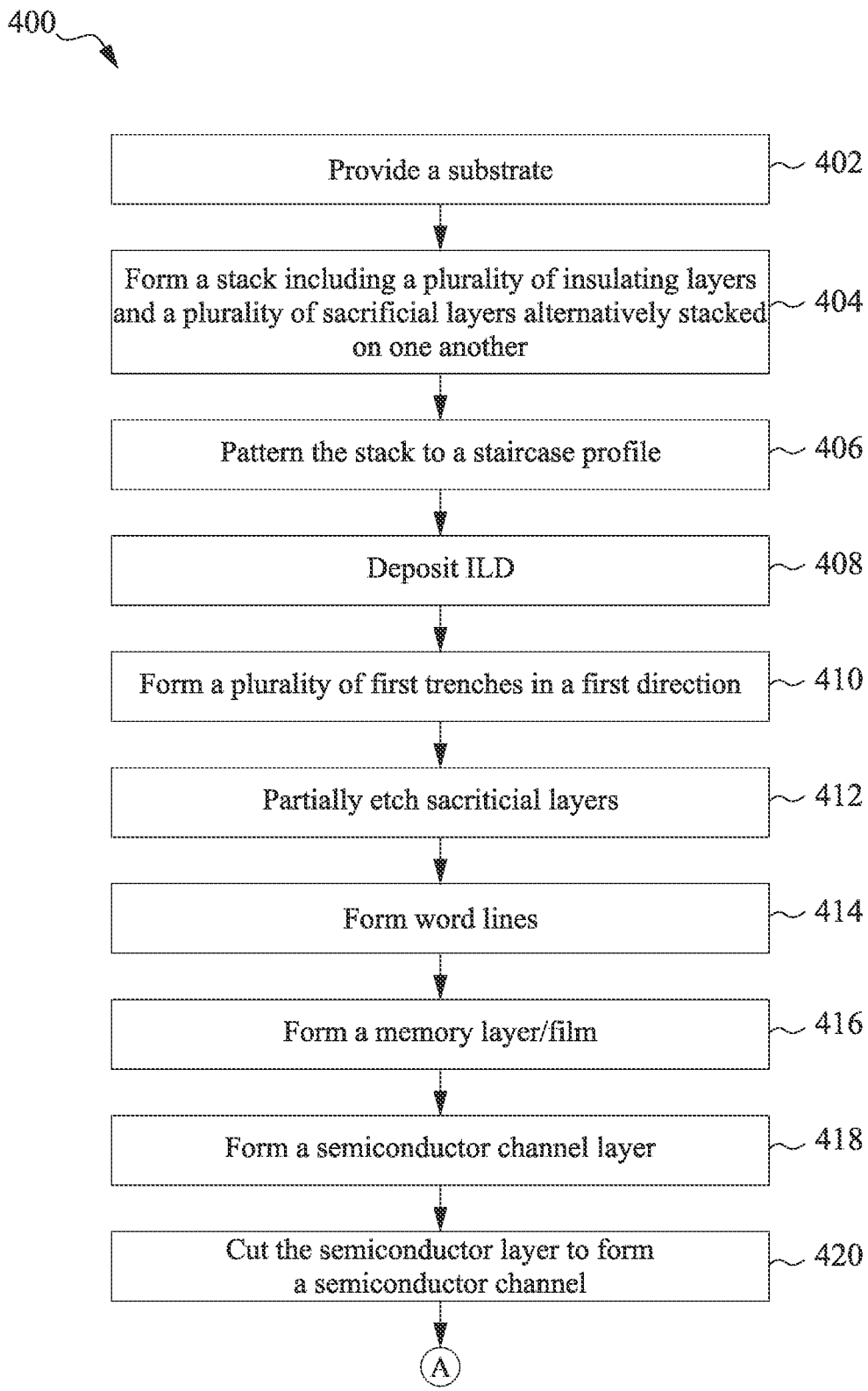
FIGS. 4A-C are an example flow chart of a method for forming a semiconductor device, in accordance with some embodiments.
Figure 4B:
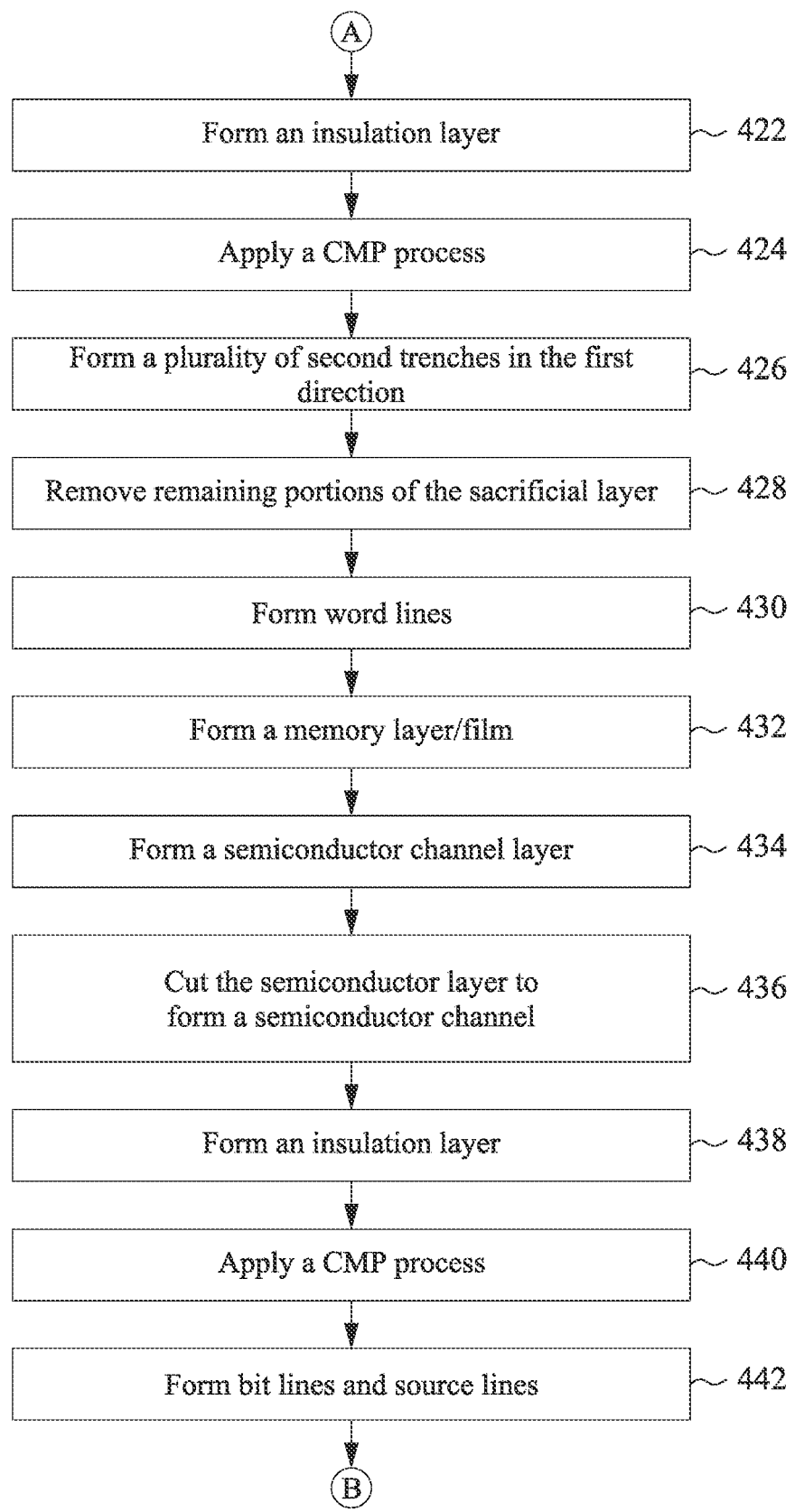
Figure 4C:
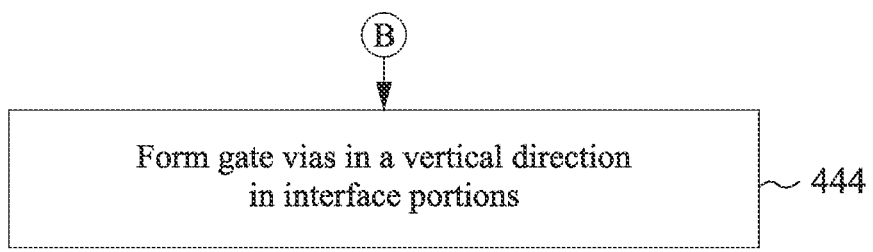

FIGS. 4A-C illustrate a flowchart of an example method 400 for forming at least a portion of a semiconductor device 500, for example, a 3D memory device (e.g., the semiconductor devices 100 and 300 described with respect to FIGS. 1 and 3, respectively), in accordance with some embodiments. It should be noted that the method 400 is merely an example, and is not intended to limit the present disclosure. Accordingly, it is understood that the order of operation of the method 400 of FIGS. 4A-C can change, that additional operations may be provided before, during, and after the method 400 of FIGS. 4A-C, and that some other operations may only be described briefly described herein.

In some embodiments, operations of the method 400 may be associated with perspective views of the example semiconductor device 500 at various fabrication stages as shown in FIGS. 5, 6, 7, 8, 9, 10, 11, 12, 13, 14, 15, 16, 17, and 18. In addition, the operations of the method 400 are equally applicable to any other semiconductor device, for example, a semiconductor device 600 shown in FIG. 21, a semiconductor device 700 shown in FIG. 23, or any other semiconductor device. Although FIGS. 5-18 illustrate the semiconductor device 500 including a plurality of memory cells, it should be understood the semiconductor device 500, 600, or 700 may include a number of other devices such as inductors, fuses, capacitors, coils, etc., which are not shown in FIGS. 5-19B, 21, and 23, for purposes of clarity of illustration.

In a brief overview, the method 400 may start with the operation 402 in which a semiconductor substrate is provided. The method 400 continues to operation 404 in which a stack is provided wherein the stack comprises a plurality of insulating layers and a plurality of sacrificial layers alternatively stacked on top of each other. The method 400 continues to operation 406 in which the stack is patterned to form a staircase profile. The method 400 continues to operation 408 in which an interlayer dielectric (ILD) is deposited. The method 400 continues to operation 410 in which a plurality of trenches extending in a first lateral direction (e.g., the X-direction) are formed. The method 400 continues to operation 412 in which the plurality of sacrificial layers are partially etched. The method 400 continues to operation 414 in which a plurality of word lines are formed. The method 400 continues to operation 416 in a memory layer or memory film is formed. The method 400 continues to operation 418 in which a semiconductor channel layer is formed. The method 400 continues to operation 420 in which the semiconductor channel layer is cut to form a semiconductor channel.

The method 400 continues to operation 422 in which an insulation layer is formed. The method 400 continues to operation 424 in which a chemical mechanical polish (CMP) process applied which may remove any excess insulation material. The method 400 continues to operation 426 in which a plurality of second trenches are formed in the first direction. The method 400 continues to operation 428 in which the remaining portions of the sacrificial value are removed. The method 400 continues to operation 430 in which a second set of word lines are formed. The method 400 continues to operation 432 in which a second memory layer or film is formed. The method 400 continues to operation 434 in which a second semiconductor channel layer is formed. The method 400 continues to operation 436 in which the second semiconductor channel layer is cut to form a semiconductor channel. The method 400 continues to operation 438 in which an insulation layer is formed. The method 400 continues to operation 440 in which a CMP process is applied. The method 400 continues to operation 442 in which BLs and SLs are formed. The method 400 continues to operation 444 in which WL staircase vias are formed in a vertical direction in the interface portions.

Corresponding to operations 402-404 of FIG. 4, FIG. 5 is a perspective view of a semiconductor device 500 including a substrate 501 and a stack 116, in accordance with some embodiments.

The substrate 501 may be a semiconductor substrate, such as a bulk semiconductor, a semiconductor-on-insulator (SOI) substrate, any other suitable material, or the like, which may be doped (e.g., with a p-type or an n-type dopant) or undoped. The substrate 501 may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or any other suitable material. The insulator layer is provided on a substrate, typically a silicon or glass substrate. Other substrates, such as a multi-layered or gradient substrate may also be used. In some embodiments, the semiconductor material of the substrate 501 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof.

The stack 116 is formed on the substrate 501. The stack includes a plurality of insulating layers 118 and a plurality of sacrificial layers 524 alternately stacked on top of each other in the vertical direction (e.g., the Z-direction). For example, one of the sacrificial layers 524 is disposed over one of the insulating layers 118, then another one of the insulating layers 118 is disposed on the sacrificial layer 524, so on and so forth. As shown in FIG. 5, a topmost layer (e.g., a layer distanced most from the substrate 501) and a bottommost layer (e.g., a layer most proximate to the substrate 501) of the stack 116 may include an insulating layer 118.

While FIG. 5 shows the stack 116 as including 4 insulating layers 118 and 3 sacrificial layers 524, the stack 116 may include any number of insulating layers 118 and sacrificial layers 524 (e.g., 4, 5, 6, 7, 8, or even more). In various embodiments, if the number of sacrificial layers 524 in the stack 116 is n, a number of insulating layers 118 in the stack 116 may be n+1.

Each of the plurality of insulating layers 118 may have about the same thickness, for example, in a range of about 5 nm to about 100 nm, inclusive. Moreover, the sacrificial layers 524 may have the same thickness or different thickness from the insulating layers 118. The thickness of the sacrificial layers 524 may range from a few nanometers to few tens of nanometers (e.g., in a range of 5 nm to 100 nm, inclusive). It is understood that the insulating layers 118 and the sacrificial layers 524 may have any suitable thickness.

The insulating layers 118 and the sacrificial layers 524 have different compositions. In various embodiments, the insulating layers 118 and the sacrificial layers 524 have compositions that provide for different oxidation rates and/or different etch selectivity between the respective layers. The insulating materials that can be employed for the insulating layer 118 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. Other insulating materials are within the scope of the present disclosure. The sacrificial layers 524 may include an insulating material, a semiconductor material, or a conductive material. Non-limiting examples of the sacrificial layers 524 include silicon nitride, an amorphous semiconductor material (such as amorphous silicon), and a polycrystalline semiconductor material (such as polysilicon). In some embodiments, the insulating layers 118 may be formed from SiO, and the sacrificial layers 524 may be formed from SiN. The sacrificial layers 524 are merely spacer layers that are eventually removed and do not form an active component of the semiconductor device 500.

In various embodiments, the insulating layers 118 and/or the sacrificial layers 524 may be grown over the substrate 501. For example, each of the insulating layers 118 and the sacrificial layers 524 may be grown by a molecular beam epitaxy (MBE) process, a chemical vapor deposition (CVD) process such as a metal organic CVD (MOCVD) process, a furnace CVD process, an atomic layer deposition (ALD) process, and/or other suitable growth processes.

Corresponding to operation 406 of FIG. 4, FIG. 6 is a perspective view of a semiconductor device 500 in which the stack 116 is patterned to form a staircase profile at one of the various stages of fabrication, in accordance with various embodiments.

To form the staircase profile, a mask layer (not shown) is deposited on the stack (on the topmost insulating layer 118), and is patterned. In some embodiments, the mask layer may include a photoresist (e.g., a positive photoresist or a negative photoresist), for example, a single layer or multiple layers of the same photoresist or different photoresists. In other embodiments, the mask layer may include a hard mask layer, for example, a polysilicon mask layer, a metallic mask layer, or any other suitable mask layer.

Next, the mask layer is patterned to etch portions of the mask layer at axial ends off the mask layer in the X-direction, for example, so as to reduce its axial width. The mask layer may be patterned using photolithography techniques. Generally, photolithography techniques utilize a photoresist material that forms the mask layer and that is deposited, irradiated (exposed), and developed to remove a portion of the photoresist material, in this instance, end portions of the mask layer. The remaining mask layer protects the underlying material, such as a portion of the stack 116 below the patterned mask layer, from subsequent processing steps, such as etching.

Next, respective portions of the topmost insulating layer 118 and the topmost sacrificial layer 526 on both sides of the mask layer in the X-direction, are etched. For example, the patterned mask layer is used to etch the exposed portions of the topmost insulating layer 118 and the topmost sacrificial layer 524 so as to form a first step (or stair) 602 (out of the topmost insulating layer 118 and sacrificial layer 524) over the next lower insulating layer 118 and sacrificial layer 524 (i.e., the second topmost insulating layer 118 and sacrificial layer 524). In some embodiments, the etch may be an anisotropic etch (e.g., a reactive ion etch (RIE), neutral beam etch (NBE), deep reactive ion etch (DRIE), any other suitable etch, or combinations thereof,) which selectively etches the exposed portions of the topmost insulating and sacrificial layers.

In some embodiments, the etching may include a first etch that selectively etches the topmost insulating layer 118 until the underlying (e.g., topmost) sacrificial layer 524 is exposed, and a second subsequent etch that etches the sacrificial layer 524 until the underlying (e.g., second topmost) insulating layer 118 is exposed. Such two-step etching process may allow the underlying sacrificial layer or the insulating layer to serve as a etch stop such that once a portion of the layer immediately above it has been removed, so as to prevent over-etching.

Next, the mask layer is again etched to reduce its axial width in the X-direction, followed by the two-step etching process to form a second step 604 (out of the second topmost insulating layer 118 and sacrificial layer 524). By iteratively performing the width reduction process on the mask layer and the two-step etching process, the stack 116 can be patterned to include a number of steps (e.g., steps 602, 604, and 606), which results in the staircase profile as shown in FIG. 6.

Figure 7:
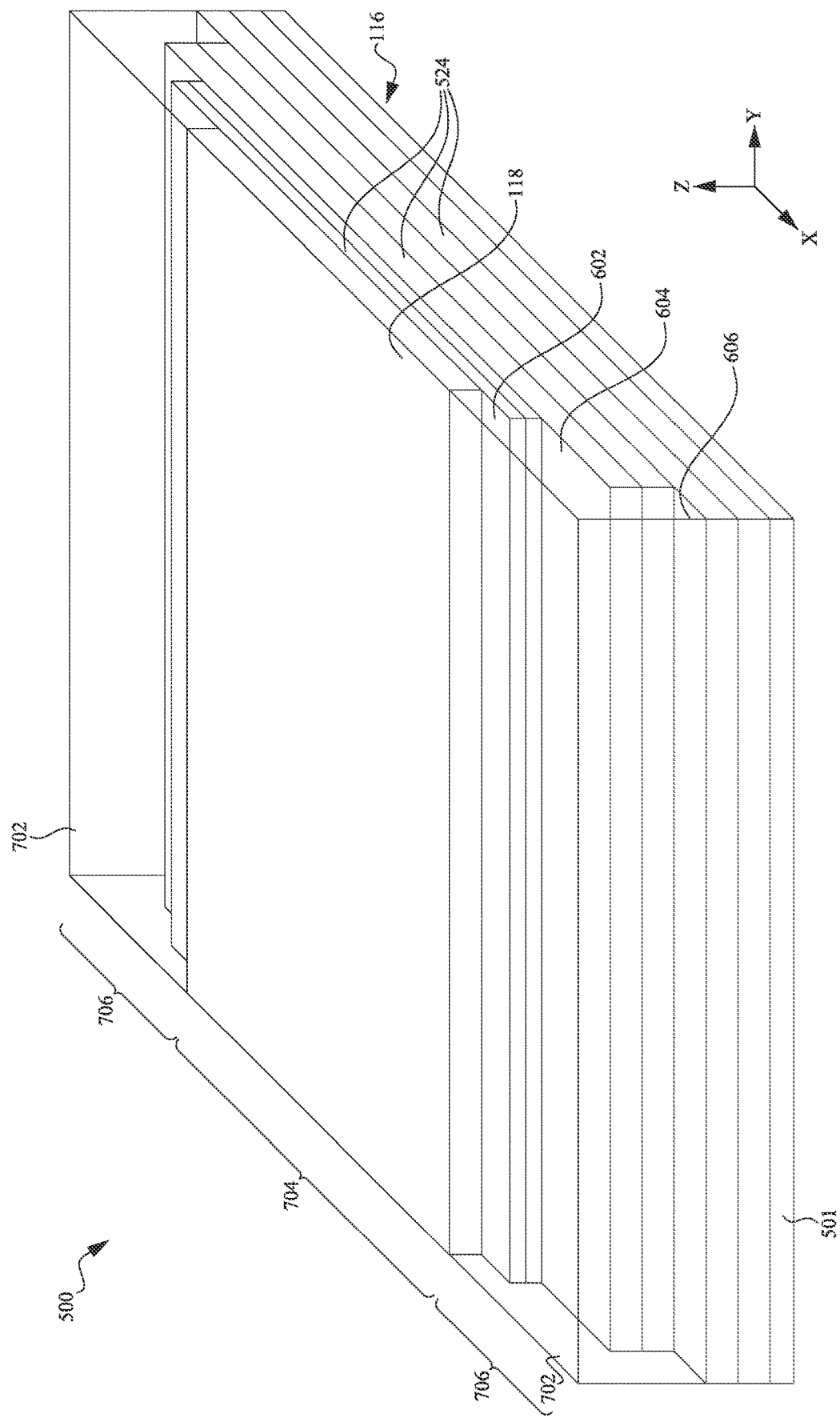

Corresponding to operation 408 of FIG. 4, FIG. 7 is a perspective view of the semiconductor device 500 in which an ILD 702 is formed over the stack 116 (having the staircase profile) at one of the various stages of fabrication, in accordance with various embodiments.

The ILD 702 can be formed by depositing a dielectric material in bulk over the partially formed semiconductor device 500, and polishing the bulk oxide back (e.g., using CMP) to the level off the topmost insulating layer 118, such that the ILD 702 is disposed only over the steps 602-606. The dielectric material of the ILD 702 may include SiO, phosphosilicate glass (PSG), borosilicate glass (BSG), boron-doped phosphosilicate Glass (BPSG), undoped silicate glass (USG), any other suitable material, or combinations thereof. Moreover, a portion of the semiconductor device 500 comprising the staircase steps 602-606 and the ILD 702 can be defined as an interface portion 706. A portion of the semiconductor device 500 comprising the stack 116 of alternating insulating layers 118 and sacrificial layers 524 can be defined as a device portion 704.

Figure 8:
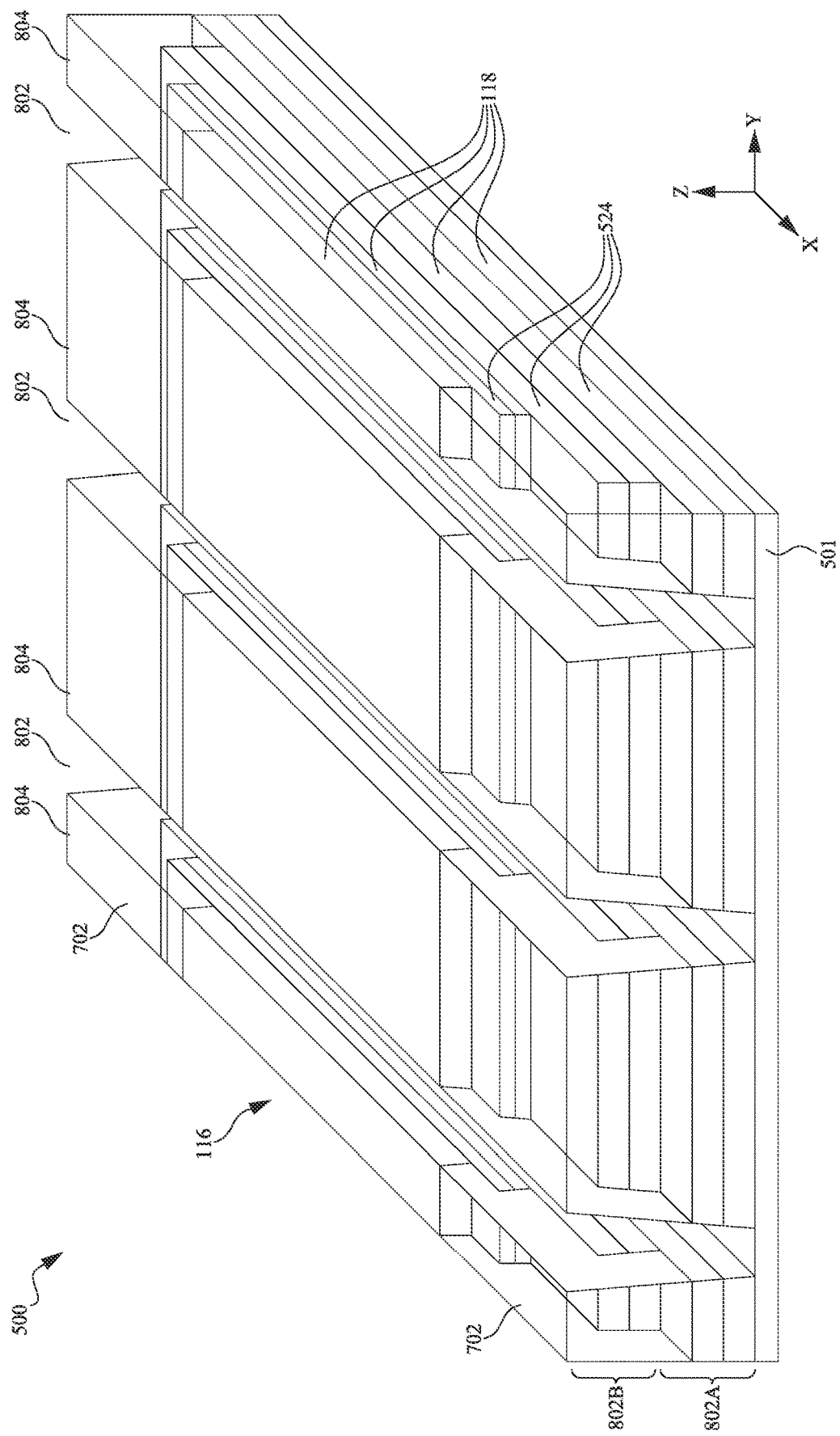

Corresponding to operation 410 of FIG. 4, FIG. 8 is a perspective view of the semiconductor device 500 with a plurality of first trenches 802 formed extending in the X-direction, in accordance with some embodiments.

Although three first trenches 802 are shown in the embodiment of FIG. 8, it should be understood that the semiconductor device 500 can include any numbers of first trenches 802, while remaining within the scope of the present disclosure.

The plurality of first trenches 802 extending in the X-direction, have been formed through the stack 116 up to the substrate 501 by etching the stack 116 in the Z-direction. The etching process for forming the plurality of first trenches 802 may include a plasma etching process, which can have a certain amount of anisotropic characteristic. For example, the first trenches 802 may be formed, for example, by depositing a photoresist or other masking layer on a top surface of the semiconductor device 500, i.e., the top surface of the topmost insulating layer 118 of the stack 116, and a pattern corresponding to the first trenches 802 defined in the masking layer (e.g., via photolithography, e-beam lithography, or any other suitable lithographic process).

The first trenches 802 may be formed using a plasma etching process (including radical plasma etching, remote plasma etching, and other suitable plasma etching processes, ME, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the first trenches 802.

As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. As shown in FIG. 8, the etch used to form the plurality of first trenches 802 etches through each of the sacrificial layers 524 and insulating layers 118 of the stack 116 such that each of the plurality of first trenches 802 extend form the topmost insulating layer 118 through the bottommost insulating layer 118 to the substrate 501. In other embodiments, a hard mask may be used. In some embodiments, the first trenches 802 may be formed with a varying width along, the Y-direction. In some embodiments, the first trenches 802 may be etched with an increasing width as the height of first trench 802 increases in the Z-direction, as shown in FIG. 8. In some embodiments, the upper portion of the first trench 802 may be exposed to more etchants in order to create the varying width.

In some embodiments, the first trenches 802 may have a first portion 802A and a second portion 802B along the Z-direction. In some embodiments, the width of the first trenches 802 may decrease along the first portion 802A and increase along the second portion 802B with an increasing height along the Z-direction. In some embodiments, the width of the first trenches 802 may increase along the first portion 802A and decrease along the second portion 802B with an increasing height along the Z-direction.

As a result of forming the first trenches 802, fin-like structures 804 are formed. As shown, the fin-like structures 804 (sometimes referred to as stripe structures) all extend along a lateral direction (e.g., the X direction), and are in parallel with one another. Each of the fin-like structures 804 includes a number of layers (or tiers) alternately stacked on top of one another. In particular, each fin-like structure includes an alternate stack of a number of (remaining portions of) the insulating layers 118, a number of (remaining portions of) the sacrificial layers 524, and a remaining portion of the ILD 702.

Figure 9:
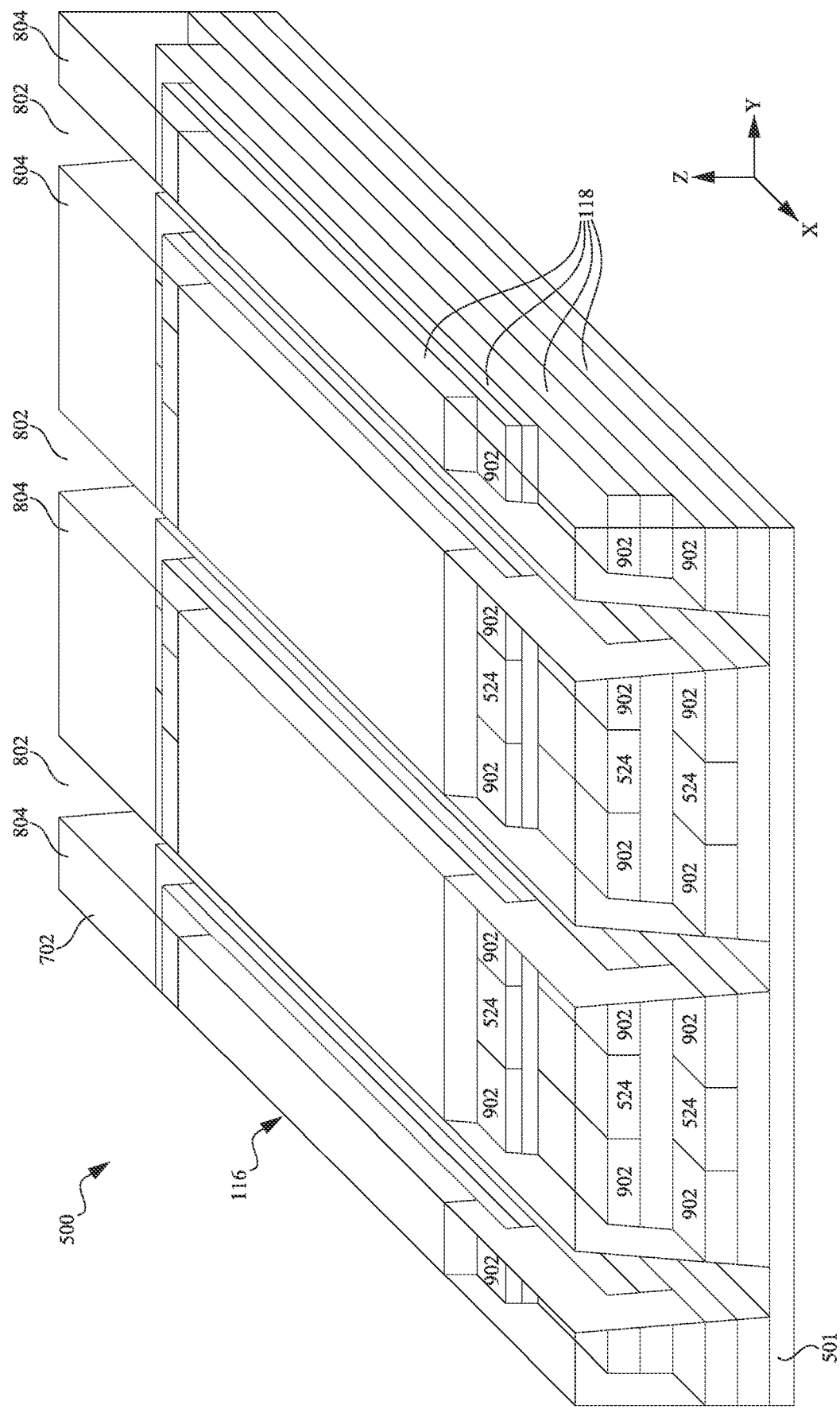

Corresponding to operations 412-414 of FIG. 4, FIG. 9 is a perspective view of the semiconductor device 500 with a plurality of word lines (WLs) 902 formed after partially etching the sacrificial layers 524 within the first trenches 802, in accordance with some embodiments.

At operation 412, the exposed surfaces of the sacrificial layers 524 within the trenches in each of the fin-like structures are partially etched so as to reduce a width of the sacrificial layers relative to the insulating layers 118 in the stack 116 (not shown). The exposed surfaces extend in the X-direction, and etching the exposed surfaces of the sacrificial layers 524 reduces a width of the insulating layers 118 on either side of the sacrificial layers 524 in the Y-direction. Such an etch-back distance can be controlled to be less than one half the width of the sacrificial layer 118 along the Y-direction, so as to remain a central portion of the sacrificial layers 118 intact, as shown in FIG. 9. In some embodiments, the sacrificial layers 524 may be etched using a wet etch process (e.g., hydrofluoric etch, buffered hydrofluoric acid). In other embodiments, the exposed surfaces of the sacrificial layers 524 may be partially etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Partially etching the sacrificial layers in the Y-direction reduces a width of the sacrificial layers 524 relative to the insulating layers 118 disposed in the stack 116 such that first cavities are formed whose boundaries are formed by top and bottom surfaces of adjacent insulating layers 118 and a surface of the partially etched sacrificial layers 524 that face the first trenches 802 and extend in the X-direction (not shown).

In some embodiments, an adhesive layer is then formed on sidewalls of the cavities (not shown). In some embodiments, the adhesive layer is optional. In various embodiments, the adhesive layers may include a material that has good adhesion with each of the insulating layers 118, the sacrificial layers 524, and the WLs 902, for example, Ti, Cr, etc. In some embodiments, the adhesive layer (e.g., the adhesive layer 122) may include e.g., titanium (Ti), chromium (Cr), or any other suitable adhesive material. The adhesive layers may be deposited using any suitable method including, for example, molecular beam deposition (MBD), atomic layer deposition (ALD), PECVD, and the like. In some embodiments, the adhesive layer may have a thickness in a range of 0.1 nm to 5 nm, inclusive.

At operation 414, a plurality of WLs 902 are formed in the first cavities located in the trenches. The exposed edges of the word lines may be etched back such that the edges of the WLs 902 facing the trenches are axially aligned in the Z-direction with corresponding edges of the insulating layers 118 disposed adjacent thereto, as shown in FIG. 9.

In various embodiments, the WLs 902 are formed by filling a gate metal in the cavities over the optional adhesive layer, such that the WLs 902 inherit the dimensions and profiles of the cavities. The WLs 902 can be formed by filling the first cavities with a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The WLs 902 can be formed by overlaying the workpiece with the above-listed metal material by, for example, chemical vapor deposition (CVD), physical vapor deposition (PVD), electroless plating, electroplating, any other suitable method, or combinations thereof.

Although each WL 902 shown in FIG. 9 is shown as a single layer, the word line material may include a stack of multiple metal materials. For example, the word line material may be a p-type work function layer, an n-type work function layer, multi-layers thereof, any other suitable material, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt (sometimes referred to as Vat) is achieved in the device that is to be formed. The work function layer(s) may be deposited by CVD, physical vapor deposition (PVD), ALD, and/or other suitable processes.

Formation of the WLs 902 in the cavities may cause edges of the WLs 902 in the Y-direction to protrude outwards of the cavities, i.e., outwards of the corresponding edges of the insulating layers 118, and/or the material forming the WLs 902 may also be deposited on exposed surfaces of the insulating layers 118 that face the first trenches 802 and/or the substrate 501. The protruding edges of the WLs 902 are etched, for example, using a selective wet etching or dry etching process (e.g., RIE, DRIE, etc.) until any gate material deposited on the surfaces of the insulating layers 118 and/or the substrate 501, and edges of the WLs 902 facing the first trenches 802 are substantially axially aligned with corresponding edges of the insulating layers 118.

Figure 10:
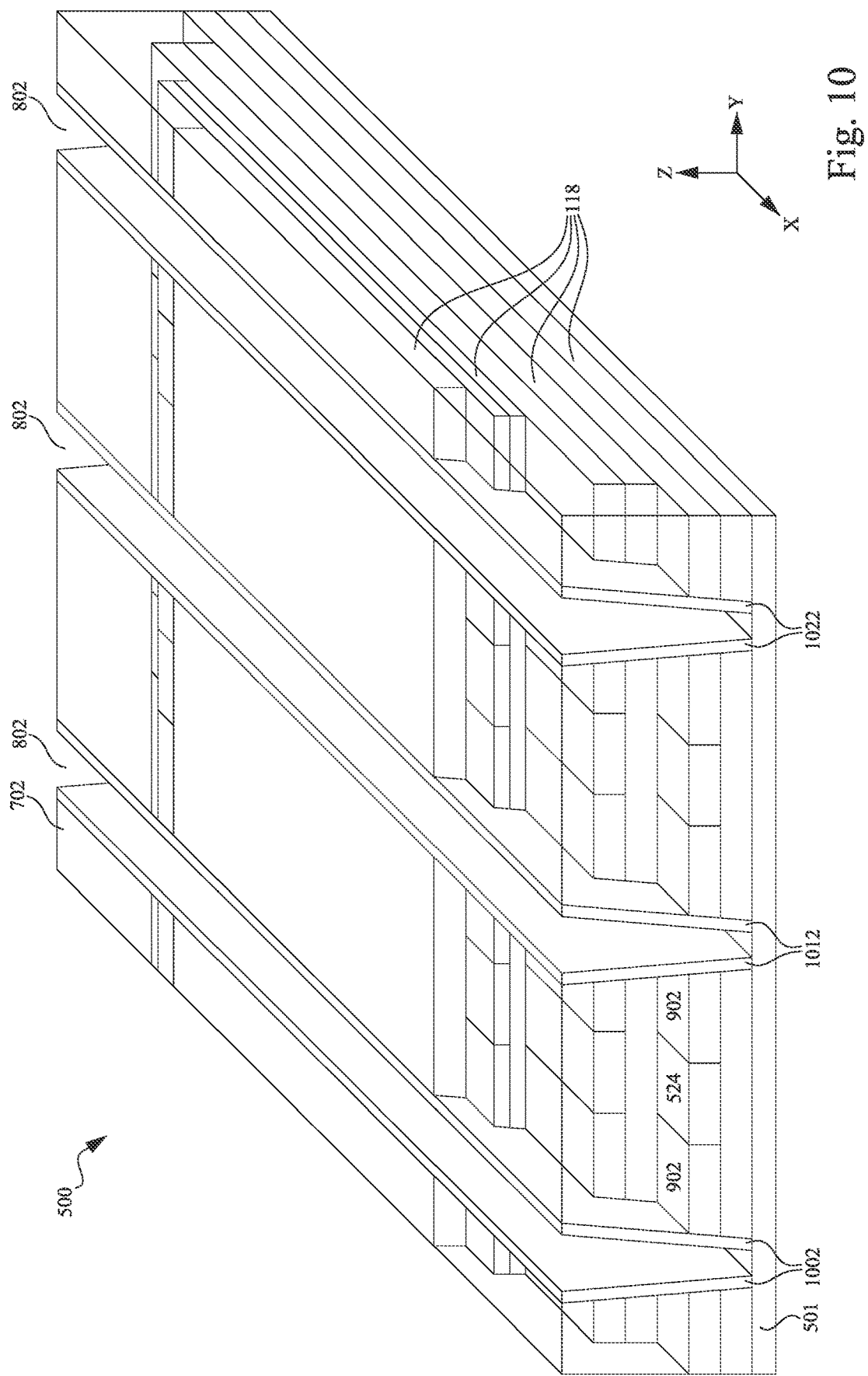

Corresponding to operations 416 of FIG. 4, FIG. 10 is a perspective view of the semiconductor device 500 in which memory layers 1002, 1012, and 1022 are formed in each of plurality of first trenches 802 on exposed surfaces of the insulating layers 118 and the WLs 902 located in the first trenches 802, such that the memory layers 1002-1012 continuously extend along the X-direction, in accordance with some embodiments.

The memory layers 1002-1012 may include a ferroelectric material, for example, lead zirconate titanate (PZT), PbZr/$TiO_3$, $BaTiO_3$, $PbTiO_2$, any other suitable material, or combinations thereof, etc. However, it should be understood that the memory layers 1002-1022 can include any of various other materials that are suitable as in memory devices, while remaining within the scope of the present disclosure. For example, the memory layers 1002-1022 can include a material selected from the group consisting of: $HfO_2$, $Hr_{1-x}Zr_xO_2$, $ZrO_2$, $TiO_2$, NiO, $TaO_x$, $Cu_2O$, $Nb_2O_5$, $AlO_x$, any other suitable material, or combinations thereof. The memory layers 1002-1022 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the memory layers 1002-1022 are continuous on the walls of the first trenches 426 in the Z-direction. In some embodiments, a CMP operation may be performed after forming the memory layers 1002-1022 so that they will lie in the same X-Y plane or are level with a top surface of the topmost insulating layer 118. In various embodiments, each of the memory layers 1002-1012 includes two portions, each of which is formed to extend along one of the sidewalls of a corresponding trench. As such, each portion of the memory layer is in contact with a corresponding number of WLs (through their respective exposed sidewalls). After formation, the memory layers 1002-1022 may sometimes be referred to as memory films.

Figure 11:
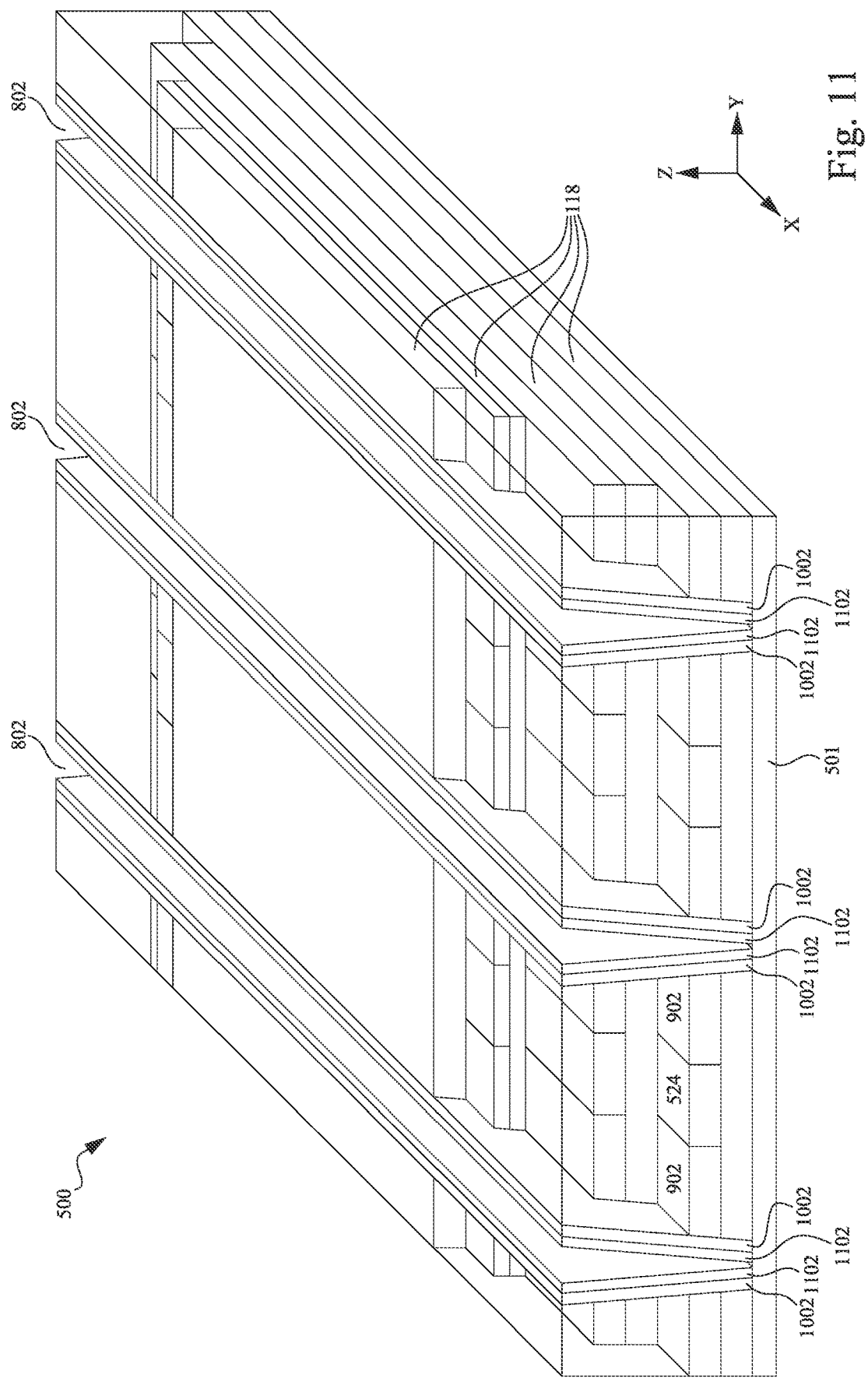

Corresponding to operations 418 of FIG. 4, FIG. 11 is a perspective view of the semiconductor device 500 in which semiconductor channel layers 1102, 1112, and 1122 are formed within each of the plurality of first trenches 802 on exposed surfaces of the memory layers 1002, 1012, and 1022, respectively, such that the semiconductor channel layers 1102-1122 also continuously extend along the X-direction in accordance with some embodiments.

In some embodiments, the semiconductor channel layers 1102-1122 may be formed from a semiconductor material, for example, Si (e.g., polysilicon or amorphous silicon), Ge, SiGe, silicon carbide (SiC), indium gallium zinc oxide (IGZO), indium tin oxide (ITO), indium zinc oxide (IZO), indium tungsten oxide (IWO), any other suitable material, or combinations thereof. The semiconductor channel layers 1102-1122 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process, or a combination thereof. A conformal coating may be deposited such that the semiconductor channel layers 1102-1122 are continuous on the inner surface of the memory layers 1002-1022, respectively. In some embodiments, a CMP operation may be performed after forming the semiconductor channel layers 1102-1122 so that they will lie in the same X-Y plane or are level with a top surface of the topmost insulating layer 118. Over the memory layer, each of the channel layers 1102-1122 also includes two portions that are in contact with the two portions of a corresponding memory layer, respectively.

Figure 12:
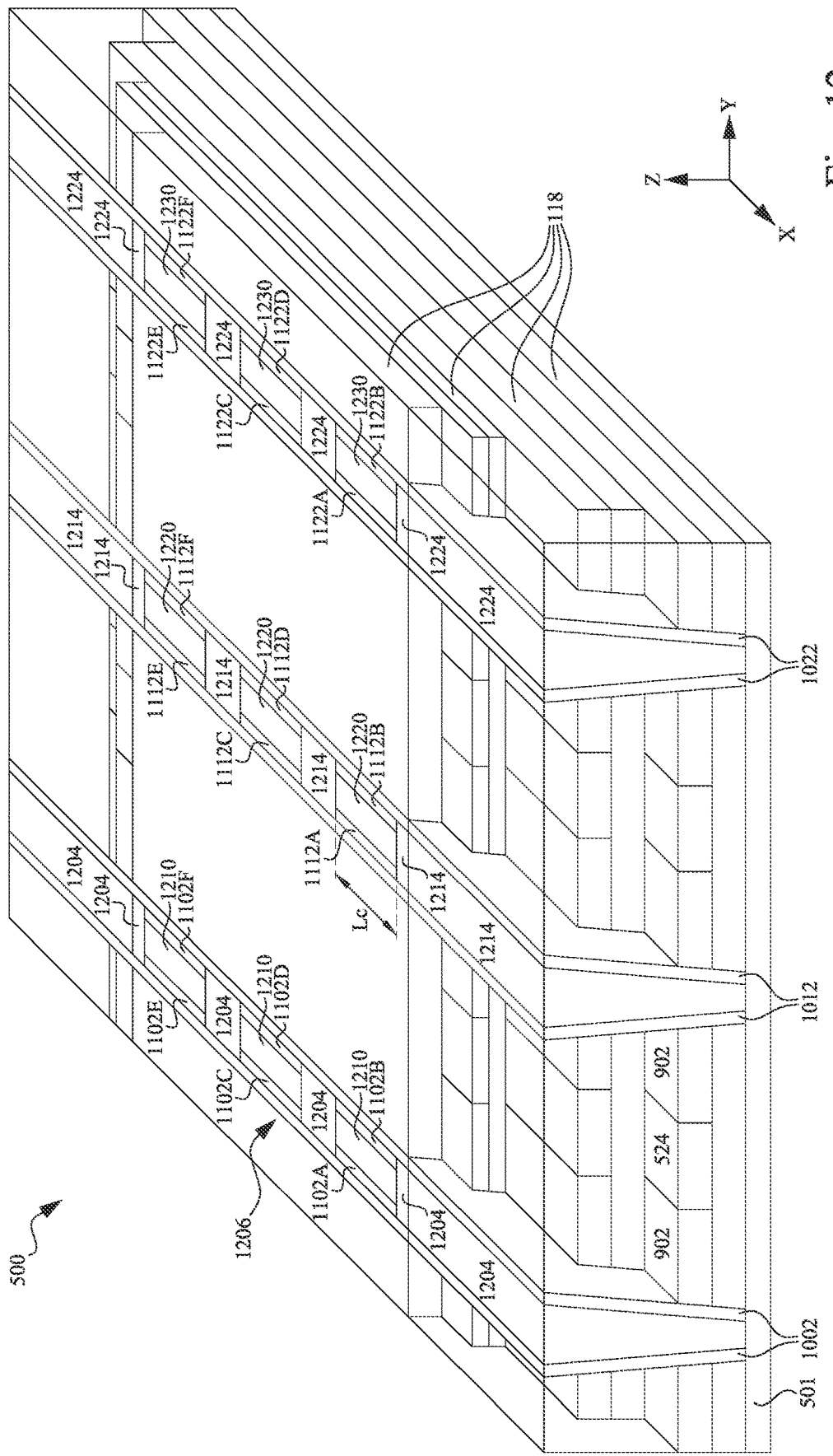

Corresponding to operations 420-424 of FIG. 4, FIG. 12 is a perspective view of the semiconductor device 500 in which the semiconductor channel layers 1102-1122 are cut along the X-direction to form semiconductor channels 1102A-F, 1112A-F, and 1122A-F, respectively, and insulation layers are formed within each of the plurality of trenches, in accordance with some embodiments.

Corresponding to operation 420, the semiconductor channel layers 1102-1122 are patterned by, for example, an anisotropic etching process to form a number of portions. Other methods of patterning the semiconductor channel layers 1102-1122 are within the scope of the present disclosure. The semiconductor channel layer 1102 is patterned to form a number of channel segments 1102A, 1102B, 1102C, 1102D, 1102E, and 1102F. The semiconductor channel layer 1112 is patterned to form a number of channel segments 1112A, 1112B, 1112C, 1112D, 1112E, and 1112F. The channel layer 1122 is patterned to form a number of channel segments 1122A, 1122B, 1122C, 1122D, 1122E, and 1122F. In various embodiments, each of the channel segments 1102A-F, 1112A-F, and 1122A-F may extend along the X-direction with a length ($L_C$), which may be configured to define the physical channel length of a memory cell. Each channel segment defines the initial footprint of a memory string.

Corresponding to operation 422, insulation layers are formed within each of the plurality of trenches by filling each of the plurality of trenches with an insulating material such that a plurality of first device segments that include the memory layers 1002-1022, the semiconductor channels 1102A-1122F, and the insulation layers are formed in the semiconductor device, and extend in the first direction parallel to each other. The insulation layers form isolation structures 1204, 1214, and 1224 as well as inner spacers 1210, 1220, and 1230.

Each of the trenches is filled with an insulating material (e.g., $SiO_2$, SiN, SiON, SiCN, SiC, SiOC, SiOCN, any other suitable material, or combinations thereof) so as to form the insulation layer. In some embodiments, the insulation layers may be formed from the same material as the plurality of insulating layers 118 (e.g., $SiO_2$). The insulation layers may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. Thus, a plurality of partially-formed memory cells 1202 that include the memory layers 1002-1022, the semiconductor channels 1102A-1122F, and the insulation layers are formed in the semiconductor device 500, and extend in the X-direction parallel to each other.

The cavities filled with the insulation layer in between the partially-formed memory cells 1206 form the isolation structures 1204, 1214, and 1224. The isolation structures 1204-1224 separate the semiconductor channels 1102A-1122F into portions such that the semiconductor channels 1102A-1122F are included in each memory cells 1206.

As shown in FIG. 12, each partially-formed memory cell 1206 includes an inner spacer 1210, 1220, or 1230 formed from a portion of the insulation layer extending between adjacent isolation structures 1204-1224 in the X-direction, in accordance with some embodiments. The semiconductor channels 1102A-1122F are disposed on outer surfaces of the inner spacers 1210-1230 in the X-direction. Corresponding to operation 424, a CMP process may then be performed after forming the insulation layer so that it will lie in the same X-Y plane or are level with a top surface of the topmost insulating layer 118.

Figure 13:
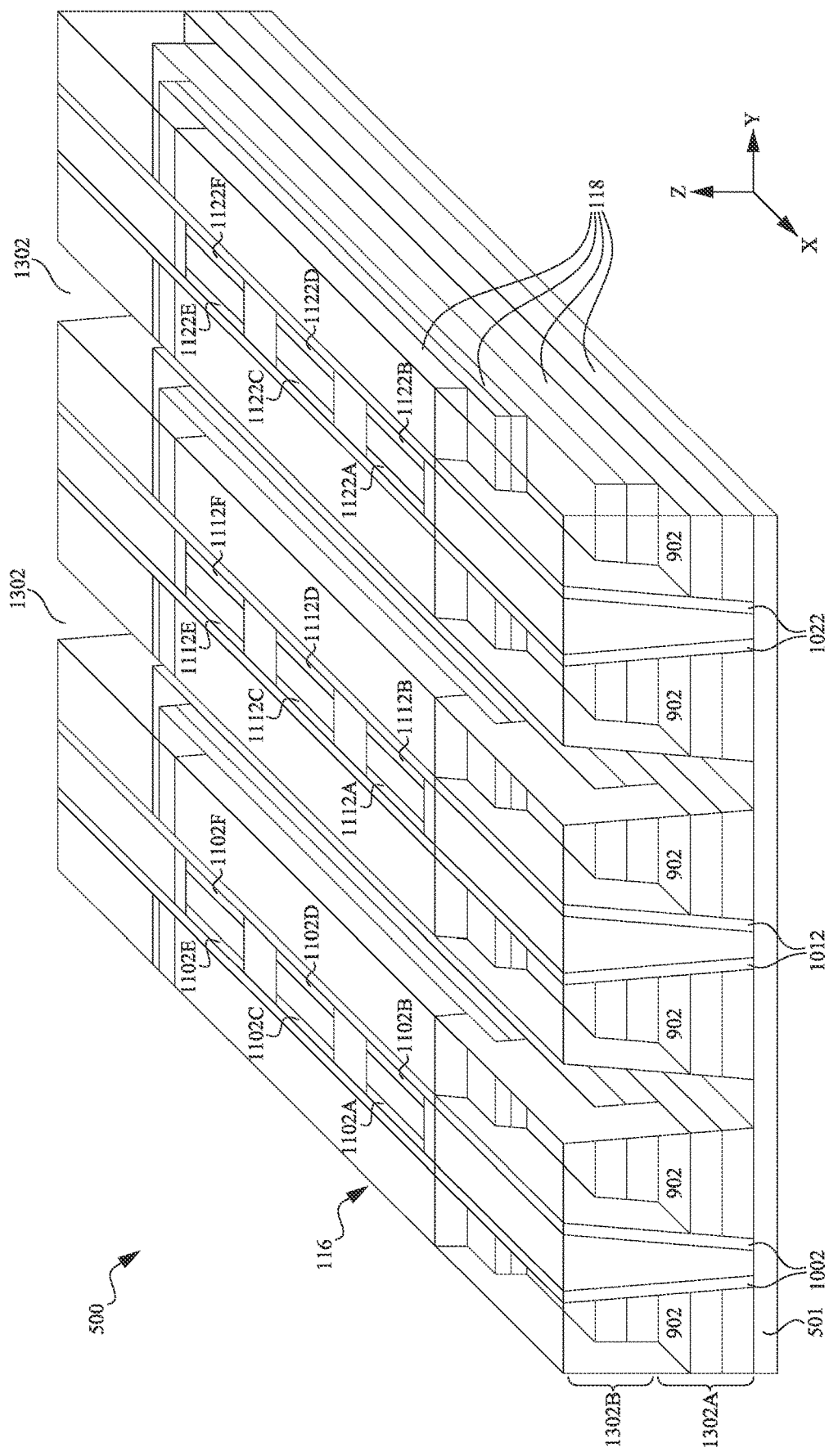

Corresponding to operations 426-430 of FIG. 4, FIG. 13 is a perspective view of the semiconductor device 500 in which a plurality of second trenches 1302 are formed between each of the first device segments such that the plurality of second trenches 1302 also continuously extends in the X-direction, and the remaining portions of the sacrificial layers 524 are etched to form a second set of WLs 902, in accordance with some embodiments.

As with the first trenches 802, the second trenches 1302 are formed by etching the stack 116 in the Z-direction to the substrate 501. FIG. 13 depicts that two second trenches 1302 are formed, but it is understood that any number of second trenches can be formed (e.g., 2, 3, 4, 5, 6, 7, 8, 9, or 10 trenches). In some embodiments, the number of second trenches formed may be one less than the number of first trenches.

The plurality of second trenches 1302 may be formed using the same process used to form the first plurality of first trenches 802. For example, the second trenches 1302 may be formed, for example, by depositing a photoresist or other masking layer on a top surface of the semiconductor device 500, i.e., the top surface of the topmost insulating layer 118 of the stack 116, and a pattern corresponding to the second trenches 1302 defined in the masking layer (e.g., via photolithography, e-beam lithography, or any other suitable lithographic process). In other embodiments, a hard mask may be used. Subsequently, semiconductor device 500 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second trenches 1302. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

The etch used to form the plurality of second trenches 1302 etches through each of the sacrificial layers 524 and insulating layers 118 of the stack 116 such that each of the plurality of second trenches 1302 extend form the topmost insulating layer 118 through the bottommost insulating layer 118 to the substrate 301. In some embodiments, the second trenches 1302 may be etched with an increasing width as the height of second trenches 1302 increases the Z-direction, as shown in FIG. 13. In some embodiments, the upper portion of the second trenches 1302 may be exposed to more etchants in order to create the varying width.

In some embodiments, the second trenches 1302 may have a first portion 1302A and a second portion 1302B along the Z-direction. In some embodiments, the width of the second trenches 1302 may decrease along the first portion 1302A and increase along the second portion 1302B with an increasing height along the Z-direction. In some embodiments, the width of the second trenches 1302 may increase along the first portion 1302A and decrease along the second portion 1302B with an increasing height along the Z-direction.

Corresponding to operation 428, the remaining portions of the sacrificial layers 524 are removed so as to form cavities between the insulating layers 118 adjacent to the previously formed WLs 902 (not shown). A second set of adhesive layers are optionally formed and WLs 902 are formed adjacent to the previously formed WLs 902. FIG. 13 is a perspective view of the semiconductor device 500 after forming a second set of WLs 902 adjacent to the previously formed WLs 902. The remaining portions of the sacrificial layers 524 may be etched using the same process as described by etching exposed portions of the sacrificial layers 524 in the second trenches 1302 until the sacrificial layers 524 are completely removed. This leaves cavities between adjacent layers of insulating layers 118 and adjacent to the WLs 902. Optionally, an adhesive layer is deposited on walls of the newly formed cavities.

Corresponding to operation 430, a WL 902 material is then deposited in the cavities so as to fill the cavities to form a second set of WLs 902 adjacent to the previously formed WLs 902 such that the two WLs 902 are disposed next to each other with the adhesive layer disposed therebetween. The WLs 902 may inherit the dimensions and profiles of the cavities. The WLs 902 can be formed by filling the first cavities with a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The WLs 902 can be formed by overlaying the workpiece with the above-listed metal material by, for example, chemical vapor deposition (CVD), physical vapor deposition (PVD), electroless plating, electroplating, any other suitable method, or combinations thereof.

Although each WL 902 is shown as a single layer, the word line material may include a stack of multiple metal materials. For example, the word line material may be a p-type work function layer, an n-type work function layer, multi-layers thereof, any other suitable material, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt (sometimes referred to as Vat) is achieved in the device that is to be formed. The work function layer(s) may be deposited by CVD, physical vapor deposition (PVD), ALD, and/or other suitable processes.

Formation of the WLs 902 in the cavities may cause edges of the WLs 902 in the Y-direction to protrude outwards of the cavities, i.e., outwards of the corresponding edges of the insulating layers 118, and/or the material forming the WLs 902 may also be deposited on exposed surfaces of the insulating layers 118 that face the second trenches 1302 and/or the substrate 501. The protruding edges of the WLs 902 are etched, for example, using a selective wet etching or dry etching process (e.g., RIE, DRIE, etc.) until any gate material deposited on the surfaces of the insulating layers 118 and/or the substrate 501, and edges of the WLs 902 facing the second trenches 1302 are substantially axially aligned with corresponding edges of the insulating layers 118.

Figure 14:
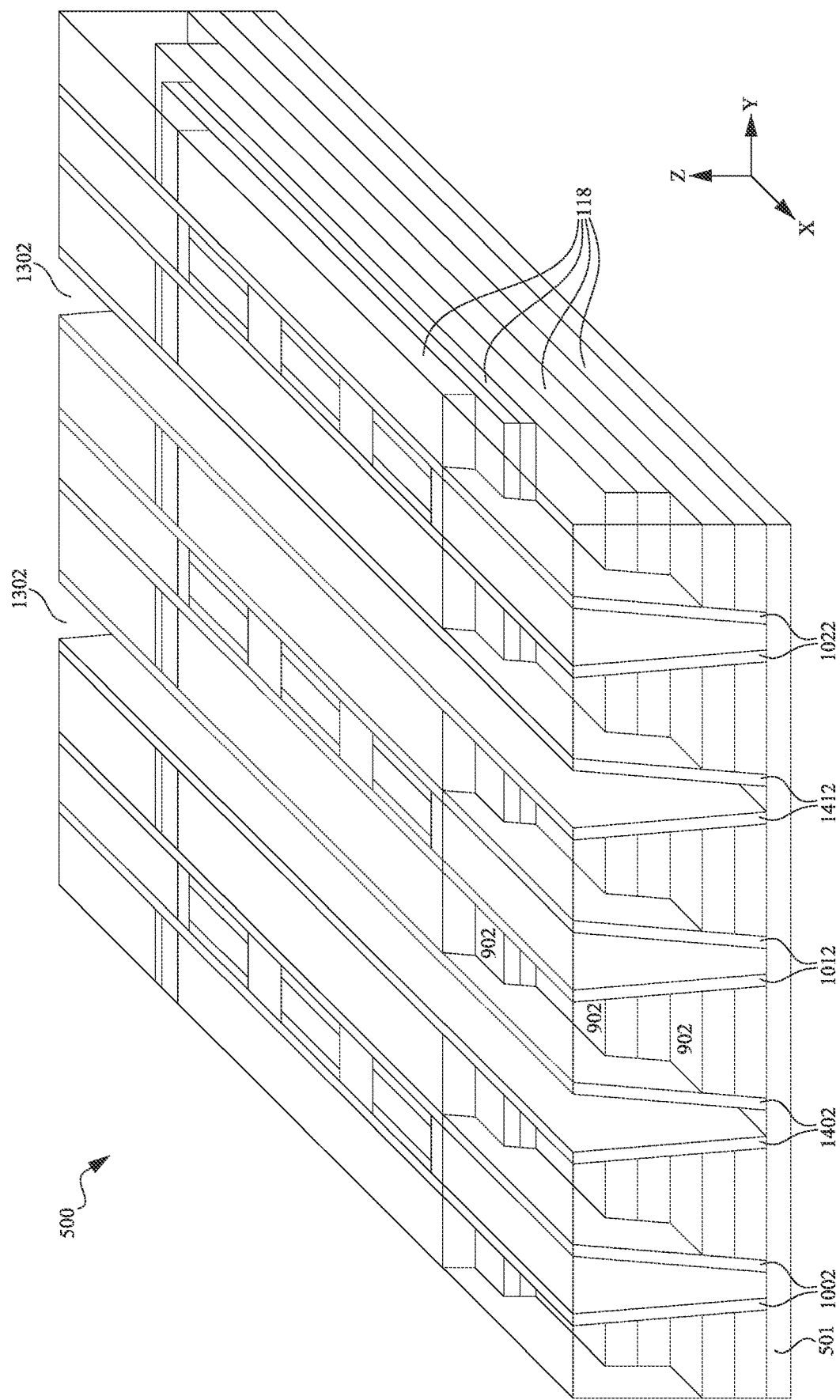

Corresponding to operation 432 of FIG. 4, FIG. 14 is a perspective view of the semiconductor device 500 in which a second set of memory layers 1402 and 1412 is formed in each of the second trenches 1302 on exposed surfaces of the insulating layers 118 and the WLs 902 located in the second trenches 1302, such that the memory layers 1402 and 1412 continuously extend along the X-direction, in accordance with some embodiments.

The second set of memory layers 1402 and 1412 are substantially similar to the memory layers 1002-1022. The memory layers 1402 and 1412 may include a ferroelectric material, for example, lead zirconate titanate (PZT), PbZr/ $TiO_3$, $BaTiO_3$, $PbTiO_2$, etc. However, it should be understood that the memory layers 1402 and 1412 can include any of various other materials that are suitable as in memory devices, while remaining within the scope of the present disclosure. For example, the memory layers 1402 and 1412 can include a material selected from the group consisting of: $HfO_2$, $Hr_{1-x}Zr_xO_2$, $ZrO_2$, $TiO_2$, NiO, $TaO_x$, $Cu_2O$, $Nb_2O_5$, $AlO_x$, and combinations thereof. The memory layers 1402 and 1412 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the memory layers 1402 and 1412 are continuous on the walls of the second trenches 1302 in the Z-direction. In some embodiments, a CMP operation may be performed after forming the memory layers 1402 and 1412 so that they will lie in the same X-Y plane or are level with a top surface of the topmost insulating layer 118. After formation, memory layers 1402 and 1412 are sometimes referred to as memory films.

Figure 15:
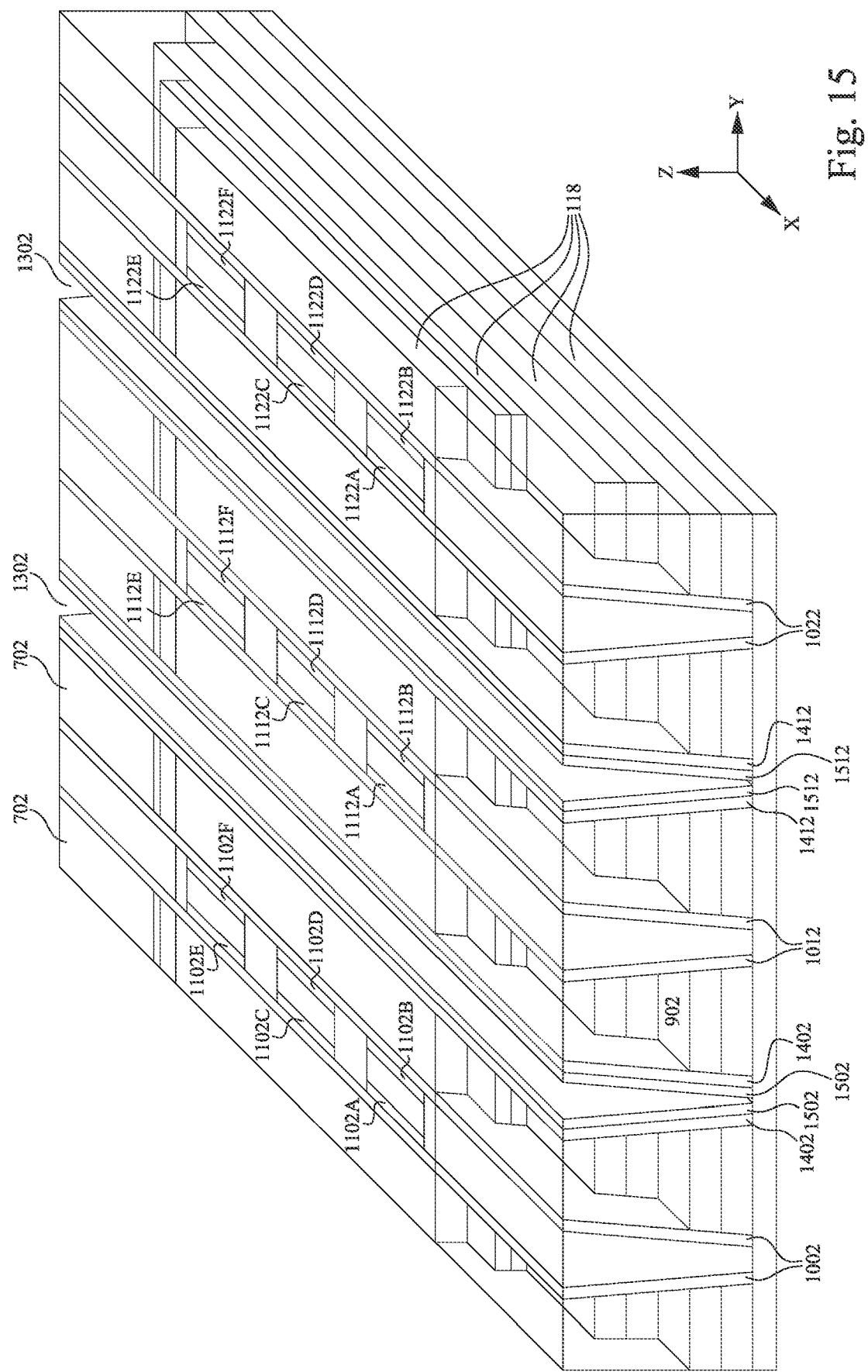

Corresponding to operation 434 of FIG. 4, FIG. 15 is a perspective view of the semiconductor device 500 in which a second set of semiconductor channel layers 1502 and 1512 are formed within each of the plurality of second trenches 1302 on exposed surfaces of the memory layers 1402 and 1412, respectively, such that the semiconductor channel layers 1402 and 1412 also continuously extend along the X-direction, in accordance with some embodiments.

The second set of semiconductor channel layers 1502 and 1512 are substantially similar to the semiconductor channel layers 1102, 1112, and 1122. In some embodiments, the semiconductor channel layers 1502 and 1512 may be formed from a semiconductor material, for example, silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. The semiconductor channel layers 1502 and 1512 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process, or a combination thereof. A conformal coating may be deposited such that the semiconductor channel layers 1502 and 1512 are continuous on the inner surface of the memory layers 1402 and 1412, respectively. In some embodiments, a CMP operation may be performed after forming the semiconductor channel layers 1502 and 1512 so that they will lie in the same X-Y plane or are level with a top surface of the topmost insulating layer 118.

Figure 16:
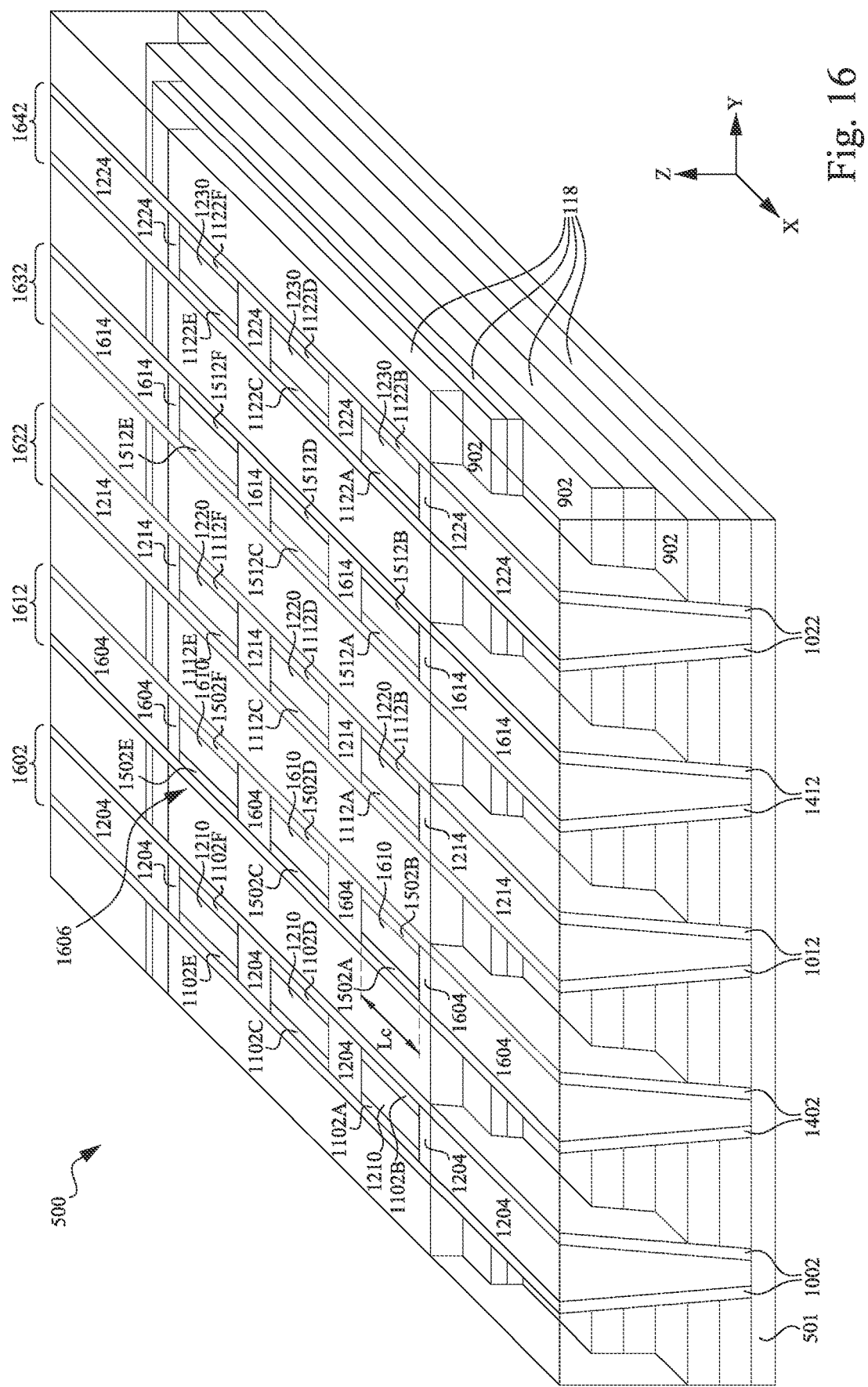

Corresponding to operation 436-440 of FIG. 4, FIG. 16 is a perspective view of the semiconductor device 500 in which the semiconductor channel layers 1502 and 1512 are cut along the X-direction to form a semiconductor channel segments 1502A-F and 1512A-F, respectively, and insulation layers are formed within each of the plurality of trenches, in accordance with some embodiments.

The semiconductor channel layers 1502 and 1512 are patterned by, for example, an anisotropic etching process to form a number of portions. Other methods of patterning the semiconductor channel layers 1502 and 1512 are within the scope of the present disclosure. The semiconductor channel layer 1502 is patterned to form a number of channel segments 1502A, 1502B, 1502C, 1502D, 1502E, and 1502F. The semiconductor channel layer 1512 is patterned to form a number of channel segments 1512A, 1512B, 1512C, 1512D, 1512E, and 1512F. In various embodiments, each of the channel segments 1502A-F and 1512A-F may extend along the X-direction with a length ($L_C$), which may be configured to define the physical channel length of a memory cell.

Corresponding to operation 438, insulation layers are formed within each of the plurality of trenches by filling each of the plurality of trenches with an insulating material such that a plurality of second device segments that include the memory layers 1402 and 1412, the semiconductor channels 1502A-1512F, and the insulation layers are formed in the semiconductor device, and extend in the X-direction parallel to each other. The insulation layers form isolation structures 1604 and 1614 as well as inner spacers 1610 and 1620.

Each of the trenches is filled with an insulating material (e.g., $SiO_2$, SiN, SiON, SiCN, SiC, SiOC, SiOCN, any other suitable material, or combinations thereof) so as to form the insulation layer. In some embodiments, the insulation layer may be formed from the same material as the plurality of insulating layers 118 (e.g., $SiO_2$). The insulation layer may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. Thus, a plurality of partially-formed memory cells 1606 that include the memory layers 1402 and 1412, the semiconductor channels 1502A-1512F, and the insulation layers are formed in the semiconductor device 500 and extend in the X-direction parallel to each other.

The cavities filled with the insulation layer in between the partially formed memory cells 1606 form the isolation structures 1604 and 1614. The isolation structures 1604 and 1614 separate the semiconductor channels 1502A-1512F into portions such that the semiconductor channels 1502A-1512F are included in each partially-formed memory cell 1606.

Each partially-formed memory cell 1606 includes an inner spacer 1610 or 1620 formed from a portion of the insulation layer extending between adjacent isolation structures 1604 or 1614 in the X-direction. The semiconductor channels 1502A-1512F are disposed on outer surfaces of the inner spacers 1610 or 1620 in the X-direction. At operation 440, a CMP process may then be performed after forming the insulation layer so that it will lie in the same X-Y plane or are level with a top surface of the topmost insulating layer 118.

FIG. 16 also illustrates second device segments 1612 and 1632 formed between the first device segments 1602, 1622, and 1642. Each of the second device segments 1612 and 1632 is similar in structure to the first device segments 1602, 1622, and 1642 and include the memory layers 1402 and 1412, the semiconductor channel layers 1502A-1512F, the isolation structures 1604 and 1614, and the inner spacers 1610 and 1620. The second device segments 1612 and 1632 extend in the X-direction parallel to each other with the first device segment 1622 interposed between a pair of second device segments 1612 and 1632. Forming the first and second device segments 1602-1642 allows adjacent insulating layers 118 in the stack 116 to always be supported by either the sacrificial layers 524 during formation of the WLs 902 included in the first device segments 1602, 1622, and 1642, or supported by the WLs 902 of the first device segments 1602, 1622, and 1642 during formation of the second device segments 1612 and 1632, while allowing increase in a device packing density of the semiconductor device 500.

Figure 17:
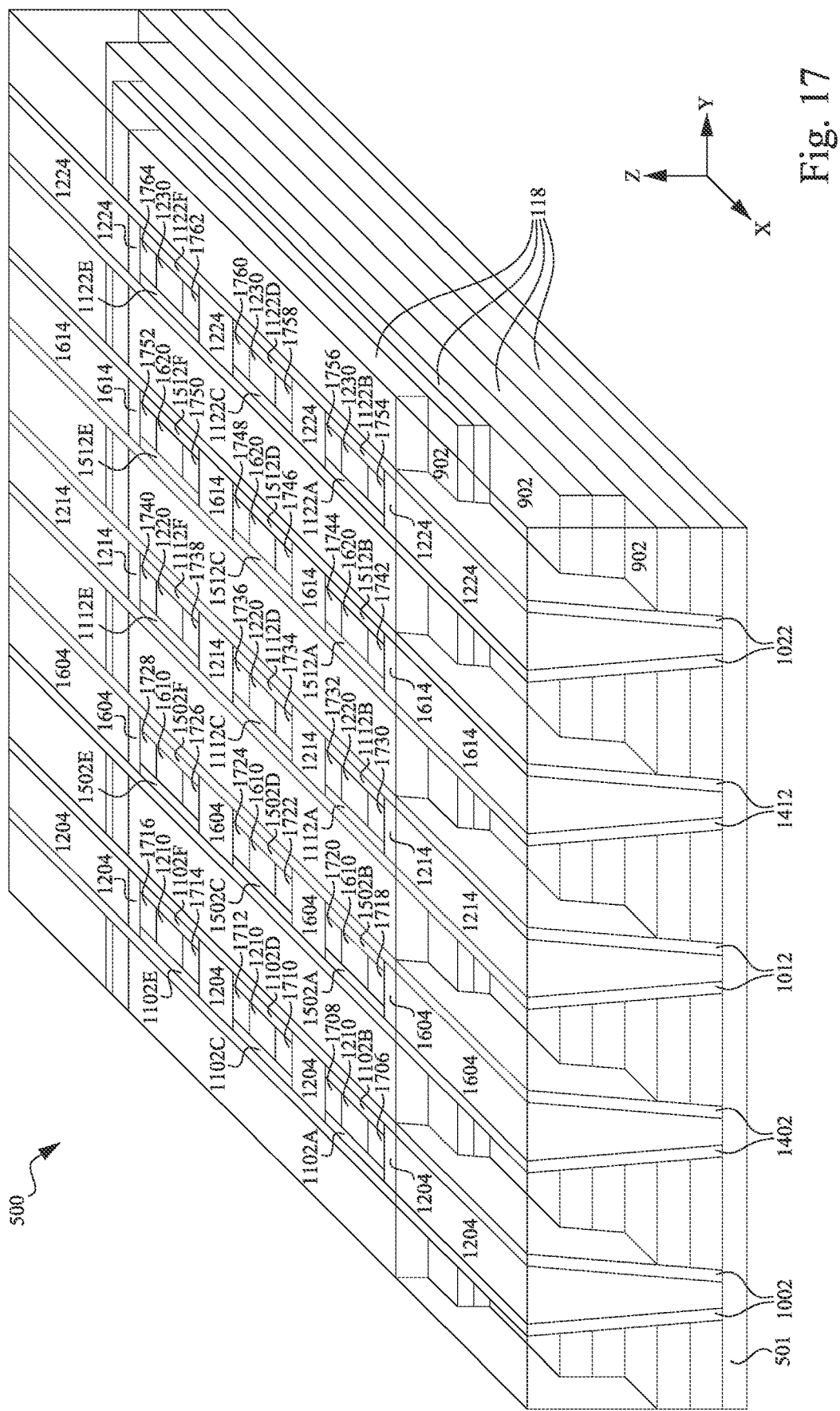

Corresponding to operation 442 of FIG. 4, FIG. 17 is a perspective view of the semiconductor device 500 in which a number of source lines (SLs) 1706, 1710, 1714, 1718, 1722, 1726, 1730, 1734, 1738, 1742, 1746, 1750, 1754, 1758, and 1762 and bit lines (BLs) 1708, 1712, 1716, 1720, 1724, 1728, 1732, 1736, 1740, 1744, 1748, 1752, 1756, 1760, and 1764 are formed to form memory cells, in accordance with some embodiments. In some embodiments, a source line or a bit line may sometimes be collectively referred to as a bit/source line. However, it should be understood that, in some embodiments, the source lines and bit lines may be coupled to different levels of (e.g., voltage) signals, when operating the semiconductor device.

The inner spacers 1210, 1220, 1230, 1610, and 1620 may be patterned to define initial footprints of a number of source lines and bit lines. The patterning generates trench portions by first etching through axial ends of the inner spacers 1210, 1220, 1230, 1610, and 1620 to the substrate 501. The axial ends of the inner spacers 1210, 1220, 1230, 1610, and 1620 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Next, the SLs 1706-1762 and the BLs 1708-1764 may be formed, for example, using an epitaxial layer growth process to fill the trench portions with a metal material such that the SLs 1706-1762 and the BLs 1708-1764 are located on opposite axial ends of the inner spacers 1210-1230 and 1610-1620, each extending from the substrate 501 to a top surface of the inner spacers 1210-1230 and 1610-1620, as shown in FIG. 17. The SLs 1706-1762 and the BLs 1708-1764 may be formed in contact with end portions of a sidewall of the semiconductor channels 1102A-F, 1112A-F, 1122A-F, 1502A-F, and 1512A-F. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure.

The SLs 1706-1762 and BLs 1708-1764 can be formed by overlaying the workpiece (e.g., to fill the recesses) with the above-listed metal material by, for example, chemical vapor deposition (CVD), physical vapor deposition (PVD), electroless plating, electroplating, or combinations thereof. In some embodiments, a control deposition step may be performed for forming the SLs 1706-1762 and the BLs 1708-1764 such that the deposition step is stopped when a height of the SLs 1706-1762 and the BLs 1708-1764 in the Z-direction are equal to a height of the stack 116. In other embodiments, a CMP operation may be performed after formation of the SLs 1706-1762 and the BLs 1708-1764 so as to ensure a top surface of each of the topmost insulating layer 118, the memory layers 1002, 1012, 1022, 1402, and 1412, the semiconductor channels 1102A-1122F and 1502A-1512F, the inner spacers 1210-1230 and 1610-1620, the SLs 1706-1762, and the BLs 1708-1764 lie in the same X-Y plane or are level with a top surface of the topmost insulating layer 118. In other embodiments, a top surface of the SLs 1706-1762 and the BLs 1708-1764 may be higher than a top surface of the topmost insulating layer 118. In some other embodiments, the top surface of the SLs 1706-1762 and the BLs 1708-1764 may be lower than the top surface of the topmost insulating layer 118.

Figure 18:
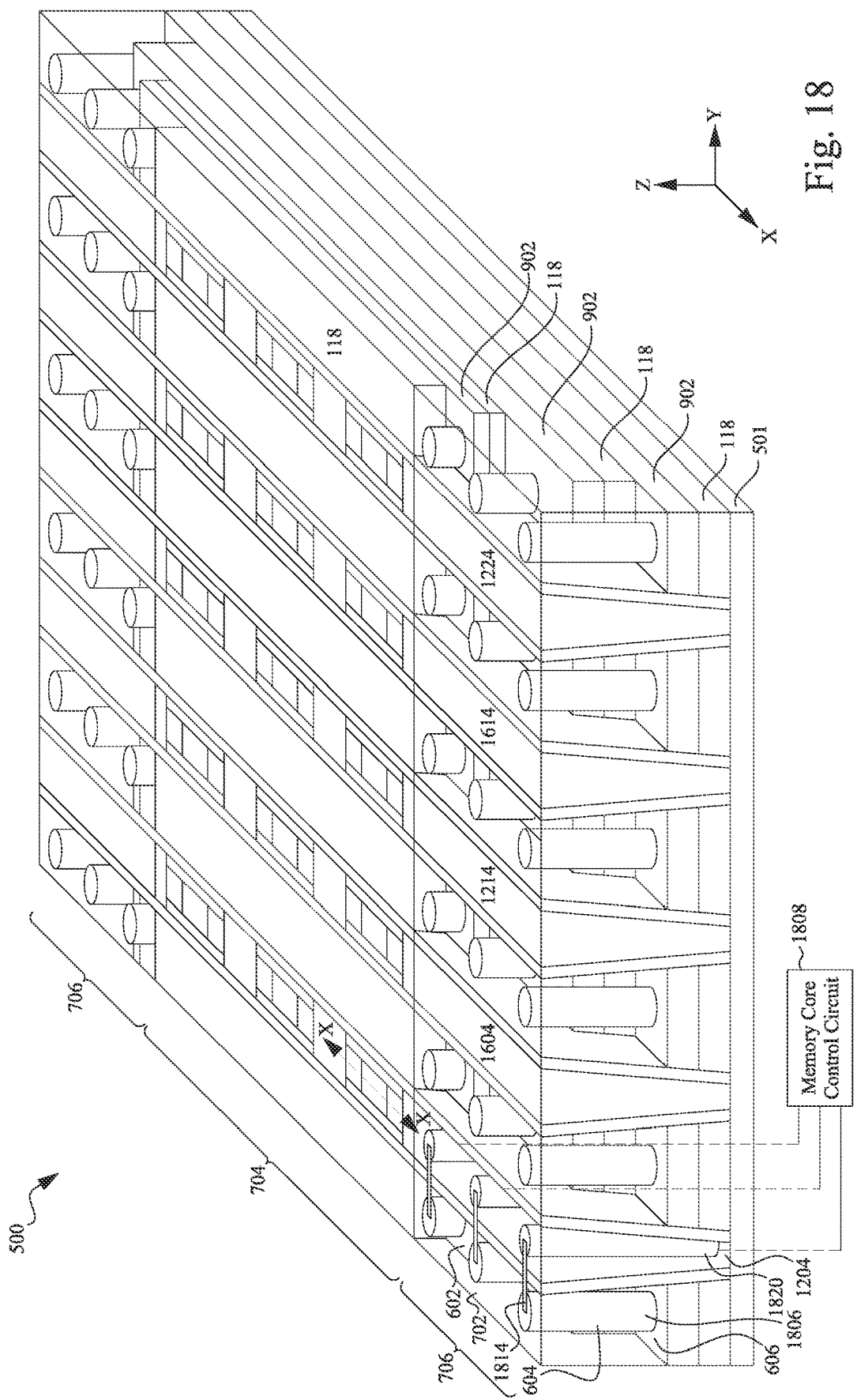

Corresponding to operation 444 of FIG. 4, FIG. 18 is a perspective view of the semiconductor device 500 in which a plurality of WL staircase vias 1806, a plurality of WL vias 1820, and a plurality of metal routings 1814 are formed, in accordance with some embodiments.

The semiconductor device 500 is comprised of a device portion 704 (substantially similar to the device portion 302 in FIG. 3) and one or more interface portion(s) 706 (substantially similar to the interface portions 304 in FIG. 3). WL staircase vias 1806 are formed in the interface portions 706 on exposed portions of the WLs 902. The WL staircase vias 1806 each penetrate through the ILD 702 with a respective height (or depth) to land on a respective word line. For example in FIG. 18, a number of WL staircase vias 1806 vertically extends with a first height to land on the WLs 902 at the first step 602; a number of WL staircase vias 1806 vertically extends with a second height to land on the WLs 902 at the second step 604; and a number of WL staircase vias 1806 vertically extends with a third height to land on the WLs 902 at the third step 606. The WL staircase vias 1806 are formed by etching the ILD 702 to form a number of openings that expose various portions of the WLs 902 at different steps, and then filled out with the openings with a metallic fill material. The metallic fill material includes at least one metal material selected from the group consisting of tungsten, copper, cobalt, ruthenium, titanium, tantalum, any other suitable material, or combinations thereof. The metallic fill material can be deposited by a conformal deposition method, which can be, for example, chemical vapor deposition (CVD), atomic layer deposition (ALD), electroless plating, electroplating, any other suitable method, or a combination thereof.

Concurrently with or subsequently to forming the WL staircase vias 1806, WL vias 1820 (substantially similar to the WL vias 310 in FIG. 3) are formed in a similar manner to the WL staircase vias. Next, metal routings 1814 (substantially similar to the metal routings 314 in FIG. 3) are formed to electrically couple the WL staircase vias 1806 to the WL vias 1820. Each of the metal routings 1814 are formed as a horizontal conductive line, as shown in FIG. 18. Similar as the WL staircase vias 1806, such metal routings 1814 and WL vias 1820 can be formed through a dual-damascene or single-damascene process by forming one or more horizontal and vertical trenches extending through an ILD and filling those trenches with a metallic fill material. The metallic fill material include at least one metal material selected from the group consisting of tungsten, copper, cobalt, ruthenium, titanium, tantalum, any other suitable material, or combinations thereof. The metallic fill material can be deposited by a conformal deposition method, which can be, for example, chemical vapor deposition (CVD), atomic layer deposition (ALD), electroless plating, electroplating, or a combination thereof.

For the purposes of clarity, only three WL vias 1820 are depicted, but it should be understood that each WL 902 can be coupled to a respective group of WL staircase via 1806, WL via 1820, and metal routing 1814, while remaining within the scope of present disclosure.

Upon forming the WL staircase vias 1806, metal routings 1814, and WL vias 1820, each of the WLs 902 can be electrically coupled to a memory core control circuit 1808 (substantially similar to the metal core control circuit 208 of FIG. 2B). As mentioned above, each WL 902 can function as a gate of each memory cell. Alternatively stated, each WL 902 can turn on or off a corresponding memory cell. Further, upon being turned on or otherwise accessed (e.g., read), the level of cell current of each memory cell can be modulated based on a voltage level applied to the corresponding WL 902. In accordance with various embodiments, the memory core control circuit 1808 can provide different voltage levels of bias to the WLs 902 through the respective group of WL staircase via, metal routing, and WL via. For example, the memory core control circuit 1808 can provide a relatively higher voltage level of (e.g., read) bias to be applied on the WL 902 that gates a memory cell having a longer channel, and provide a relatively lower voltage level of (e.g., read) bias to be applied on the WL 902 that gates a memory cell having a shorter channel. Details of different voltage levels applied to memory cells that include respective different channel lengths will be discussed as follows.

FIGS. 19A-B are a top view and a cross-section view of the semiconductor device 500 cut along a first cross-section (e.g., along X-X in FIG. 18), respectively, in accordance with some embodiments.

FIG. 19A illustrates the top view of two memory cells 1902 and 1904, each of which may be comprised of one WL, one SL, one BL, a portion of a semiconductor channel, and a portion of a memory layer.

The memory cell 1902 is one memory cell from the semiconductor device 500 and comprises a portion of the WL 902A, the SL 1706, the bit line 1708, a portion of the semiconductor channel 1102A, and a portion of the memory layer 1002A. The memory cell 1904 is another memory cell from the semiconductor device 500 and comprises a portion of the WL 902B, the SL 1706, the BL 1708, a portion of the semiconductor channel 1102B, and a portion of the memory layer 1002B. A plurality of memory cells arranged along the Z-direction can form a memory string. In some embodiments, the plurality of memory cells in the memory string conduct a current with a constant level. Li is defined as the length of the inner spacer 1210 in the between the SL 1706 and the BL 1708 in the X-direction. It is understood that semiconductor devices are not limited to the number of memory cells shown on semiconductor device 500.

FIG. 19B is a cross-section view of the semiconductor device 500 that illustrates the SL 1706 and the BL 1708 and the alternating WLs 902 and insulating layers 118 taken across the cross-section X-X along the X-direction in FIG. 18. Multiple memory cells such as but not limited to 1902 and 1904 can form respective channel lengths of memory cells arranged along a vertical direction (which are sometimes referred to as a memory string).

The dotted lines illustrate that the alternating WLs 902 and the insulating layers 118 are in a plane behind the SL 1706 and the BL 1708. For the purposes of clarity, the SL 1706, the BL 1708, and the WLs 902 are depicted in the same plane. As shown in FIG. 19B, the SL 1706 and the BL 1708 extend vertically along the Z-direction. The SL 1706 and the BL 1708 are spaced apart from each other along the X-direction. A plurality of WLs 902 alternating with insulating layers 118 extend along the X-direction and are disposed across the SL 1706 and the BL 1708. The SL 1706 and the BL 1708 may have an increasing varying width along an increasing height in the Z-direction. The varying width of the SL 1706 and the BL 1708 result in a varying channel length in the memory string. For example, the topmost channel length is $Lx_1$, and the bottommost channel length is $Lx_2$. In some embodiments, the channel length $Lx_1$ may be less than the channel length $Lx_2$. In such embodiments, the channel lengths between the bottommost channel length $Lx_2$ and the topmost channel length $Lx_1$ decrease in length along an increasing height in the Z-direction.

In such embodiments, the voltage levels of read bias applied to the WLs 902, respectively, decrease with an increasing height along the Z-direction, which corresponds to the channel lengths of memory cells gated by those WLs 902. For example, a first memory cell, gate by the topmost WL 902, has a relatively shorter channel length $Lx_1$. The topmost WL 902 may be applied with a relatively lower level of bias (hereinafter WL bias "Vtop") when accessing (e.g., reading) such a first memory cell. A second memory cell, gate by the bottommost WL 902, has a relatively longer channel length $Lx_2$. The bottommost WL 902 may be applied with a relatively higher level of bias (hereinafter WL bias "Vbottom") when accessing (e.g., reading) such a second memory cell. Further, the voltage levels applied to the WLs 902 in between the bottommost and topmost WLs 902 can decrease from Vbottom to Vtop. The varying levels of bias applied on the WLs 902 are designed to make the cell current increases with an increasing channel length so as to provide a constant cell current throughout the memory cells.

Figure 20A:
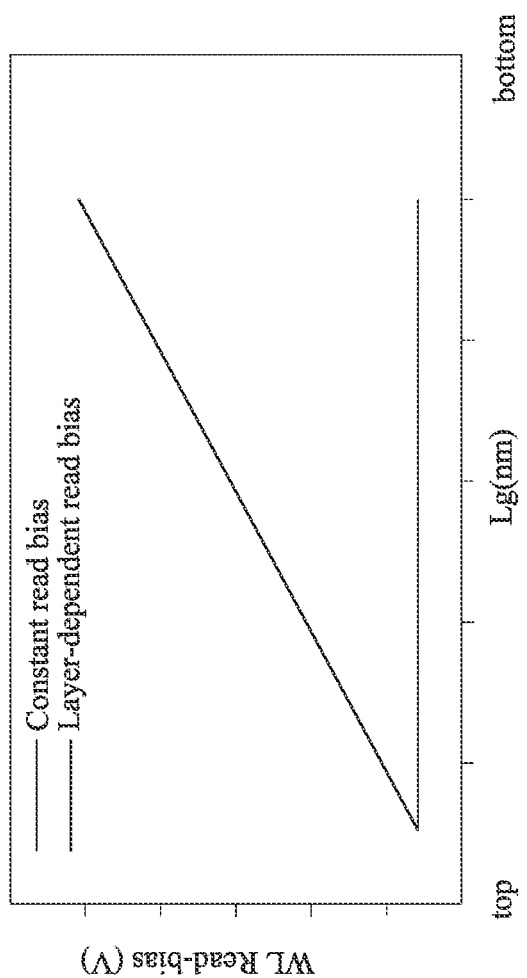
FIGS. 20A-C are plots of word line bias versus channel length, cell current versus channel length, and cell current versus channel length, respectively, of the example semiconductor device of FIGS. 19A-B, in accordance with some embodiments.
Figure 20B:
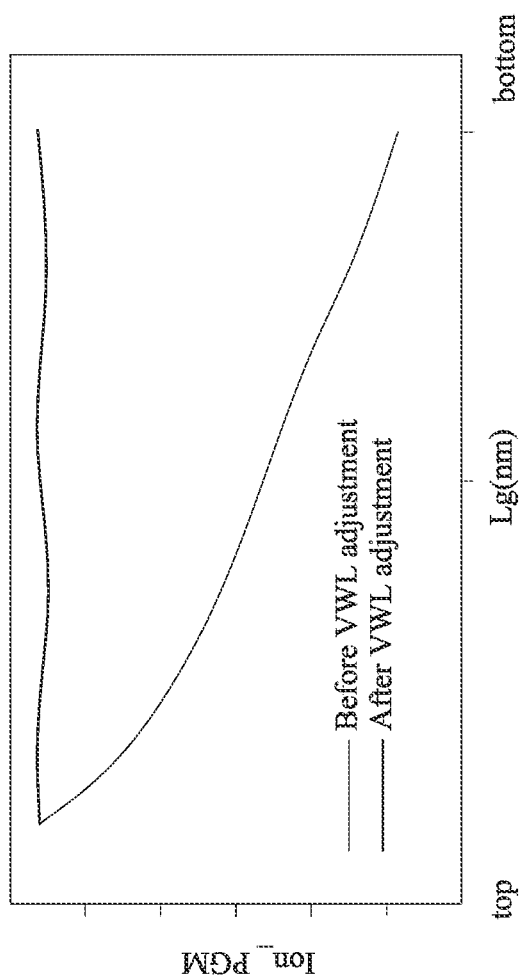
Figure 20C:
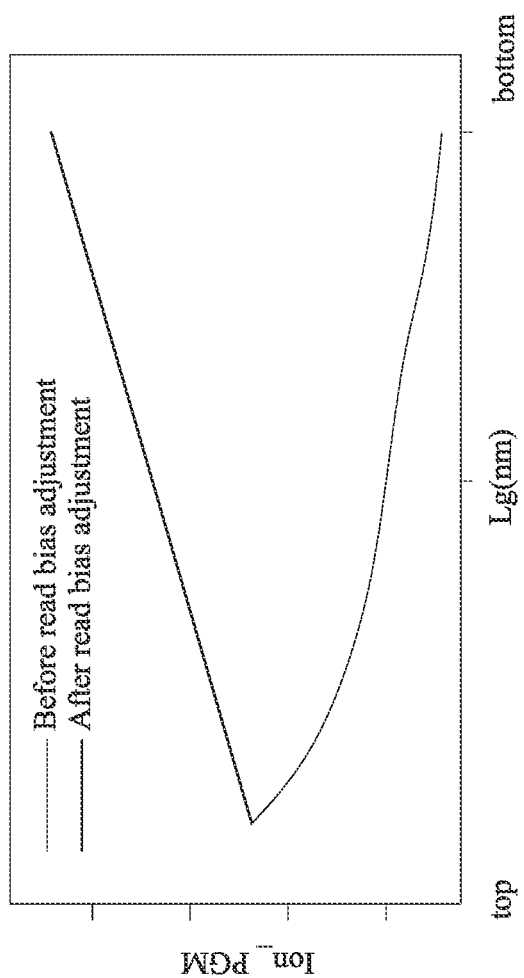

FIGS. 20A-C illustrate plots of WL read bias, cell current, and cell current, respectively, along the vertical axes that correspond to the embodiment of the semiconductor device 500 shown in FIGS. 19A-B. The horizontal axes of 19A-B are channel length of the semiconductor device 500 from the top of the device to the bottom.

In the semiconductor device 500, the channel length increases from the top to the bottom. FIG. 20A illustrates that the WL read bias shown on the vertical axis varies in accordance with different channel lengths for this embodiment, in comparison to a constant word line bias applied. From top to bottom, the channel length increases, and the word line bias increases accordingly. FIG. 20B demonstrates that the varying word line bias results in a constant cell current shown on the vertical axis, in comparison to the degradation of cell current typically observed along longer channel lengths. It is shown in FIG. 20B that increasing the WL read bias with an increasing channel length results in the desired cell current. FIG. 20C demonstrates another embodiment in which the varying word line bias can be modified in order to result in an increasing cell current shown on the vertical axis instead of the degradation of cell current typically observed along longer channel lengths. FIG. 20C demonstrates that modifying the WL read bias of the semiconductor 500 can result in any desired cell current.

Figure 21:
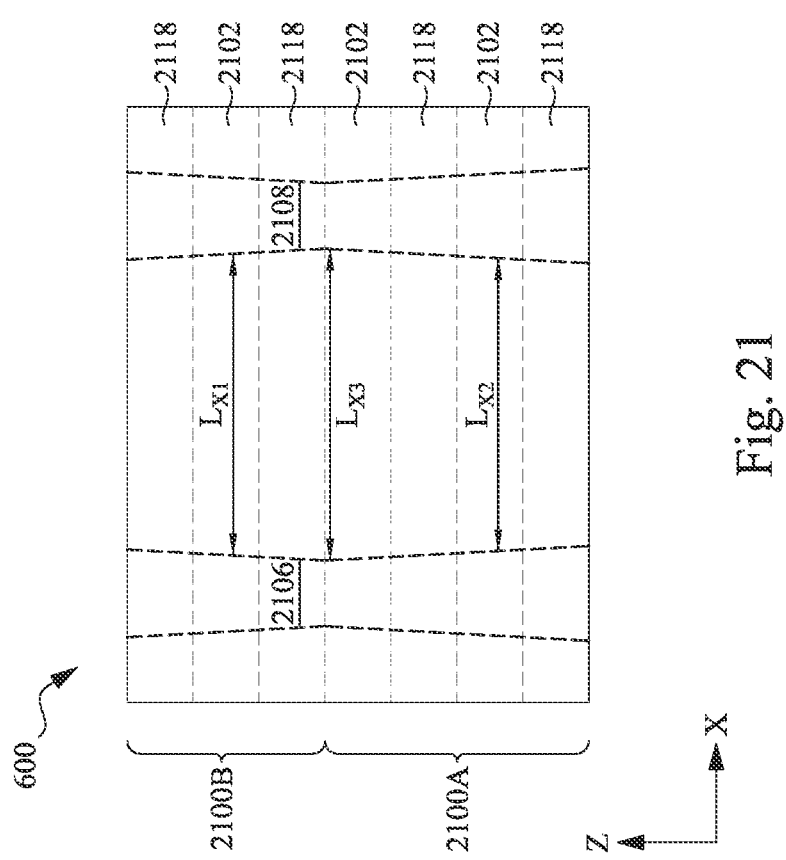
FIG. 21 illustrates a cross-sectional view cut along a first lateral cross-section (e.g., along the X-direction) of an example semiconductor device, in accordance with some embodiments.

FIG. 21 is a cross-section view of a semiconductor device 600 with a SL 2106 and a BL 2108 that have varying widths that decrease in a first portion 2100A and increase in a second portion 2100B with an increasing height along the vertical direction (e.g., the Z-direction), cut along the X-direction, in accordance with some embodiments.

The semiconductor device 600 is formed from the method 400 from FIG. 4. The semiconductor device 600 is substantially similar to the semiconductor device 500 but with a decreasing varying width of the bit lines and the source lines in a first portion and an increasing varying width of the bit lines and source lines in a second portion along an increasing height of the semiconductor device 600 along the Z-direction. In contrast, the semiconductor device 500 has a continuously increasing varying width of the bit lines and the source lines along an increasing height of the semiconductor device 500.

The semiconductor device 600 comprises the SL 2106, the BL 2108, and a plurality of alternating WLs 2102 and insulating layers 2118 which are substantially similar to the SL 1706, the BL 1708, and the plurality of alternating WLs 902 and insulating layers 118 of the semiconductor device 500 in FIG. 19B, respectively. The dotted lines illustrate that the alternating WLs 2102 and the insulating layers 2118 are in a plane behind the SL 2106 and the BL 2108. For the purposes of clarity, the SL 2106, the BL 2108, and the WLs 2102 are depicted in the same plane. As shown in FIG. 21, the width of the SL 2106 and the BL 2108 decrease with an increasing height along the first portion 2100A. The width of the SL 2106 and BL 2108 increase with an increasing height along the second portion 2100B. The varying width of the SL 2106 and the BL 2108 result in a varying channel length. For example, the topmost channel length is $Lx_1$, the bottommost channel length is $Lx_2$, and the channel length at the point where the first portion 2100A meets the second portion 2100B is $Lx_3$. In some embodiments, the channel length $Lx_3$ is greater than the channel lengths $Lx_1$ and $Lx_2$. In some embodiments, the channel length $Lx_1$ is equal to the channel length $Lx_2$. In some embodiments, the channel lengths between the bottommost channel length $Lx_2$ and the channel length $Lx_3$ increase in length in an increasing height along the Z-direction. In some embodiments, the channel length $Lx_3$ and the topmost channel length $Lx_1$ decrease in length in an increasing height along the Z-direction.

The semiconductor device 600 further comprises memory layers and semiconductor channels corresponding to SL 2106 and the BL 2108 (not shown). The memory layers and the semiconductor channels of the semiconductor device 600 are substantially similar to the memory layers 1002-1022 and 1402-1412 and the semiconductor channels 1102A-1122F and 1502A-1512F, respectively, in the semiconductor device 500.

In some embodiments, the voltage level of bias applied to the WLs 2102 increases along the first portion 2100A and decreases along the second portion 2100B with an increasing height in the Z-direction. The voltage level of bias applied to the WLs 2102 may be positively proportional to the channel length. For example, the topmost WL 2102 corresponding to the channel length $Lx_1$ may have a first level of bias applied. The bottommost WL 2102 corresponding to the channel length $Lx_2$ has may have a second level of bias applied. The WL 2102 at the point where the first portion 2100A meets the second portion 2100B (sometimes referred to as a middle one of the plurality of third conductive structures) corresponding to the channel length $Lx_3$ may have a third level of bias applied. In some embodiments, the third level of read bias is greater than the first level of bias and second level of bias. In some embodiments, the first level of bias may be equal to the second level of read bias. The varying levels of bias applied to the WLs 1502 are designed to make cell current increase or remain constant with varying channel lengths. In some embodiments, the plurality of memory cells in a memory string conduct a current with a constant level. It is understood that the semiconductor device 600 is not limited to the three WLs 2102 shown in FIG. 21, and that the middle one of the plurality of third conductive structures can refer to any WL 2102 between the topmost WL 2102 and the bottommost WL 2102.

Figure 22A:
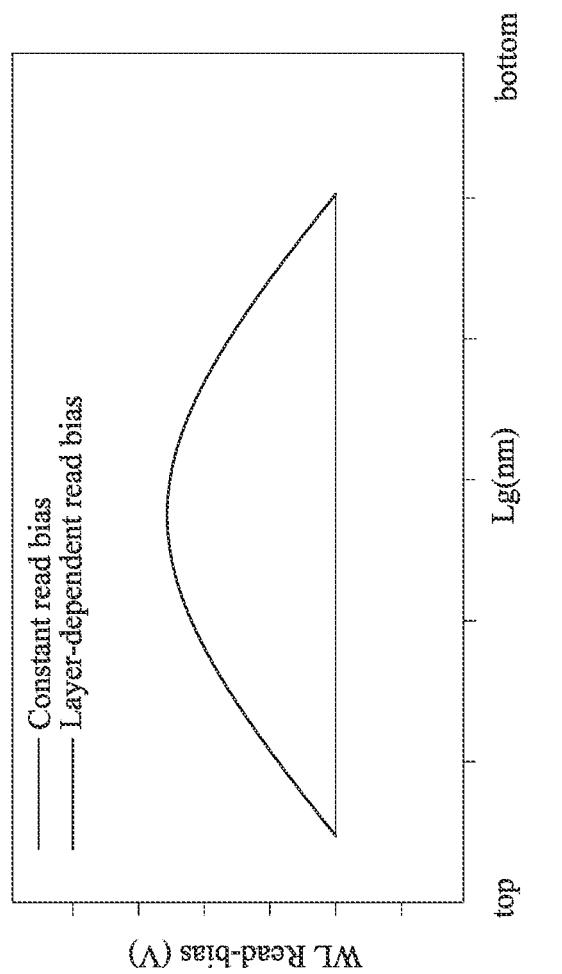
FIGS. 22A-B are plots of word line bias versus channel length and a cell current versus channel length, respectively, of the example semiconductor device of FIG. 21, in accordance with some embodiments.
Figure 22B:
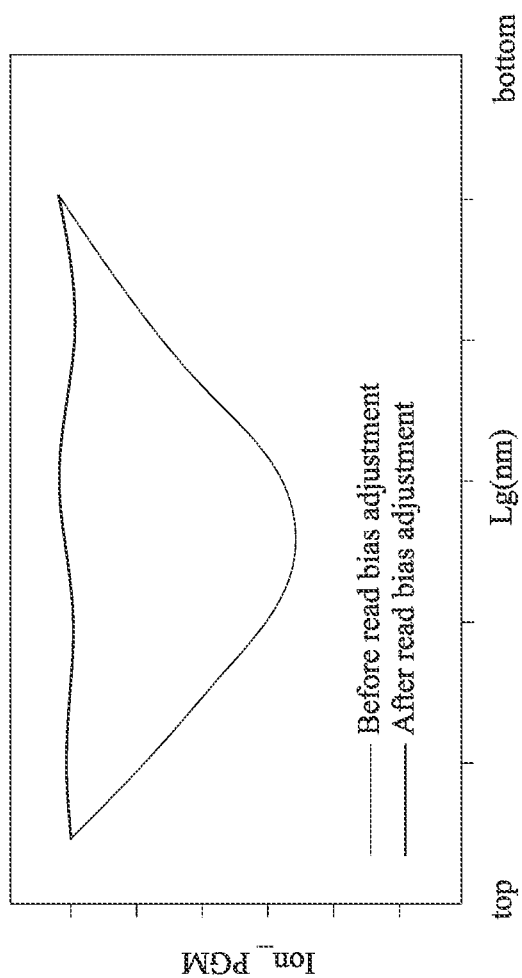

FIGS. 22A-B illustrate plots of WL read bias and cell current, respectively, along the vertical axes that correspond to the embodiment of the semiconductor device 600 shown in FIG. 21. The horizontal axes of FIGS. 22A-B are channel length of the semiconductor device 600 from the top of the device to the bottom.

In the semiconductor device 600, the channel length increases from the bottom along a first portion and decreases along a second portion to the top. FIG. 22A illustrates that the WL read bias shown on the vertical axis directly corresponds to the channel length for this embodiment, in comparison to a constant WL read bias typically applied. FIG. 22B demonstrates that the varying WL read bias results in a constant cell current shown on the vertical axis, in comparison to the degradation of cell current typically observed along longer channel lengths. It is shown in FIG. 22B that increasing the WL read bias with an increasing channel length results in the desired cell current.

Figure 23:
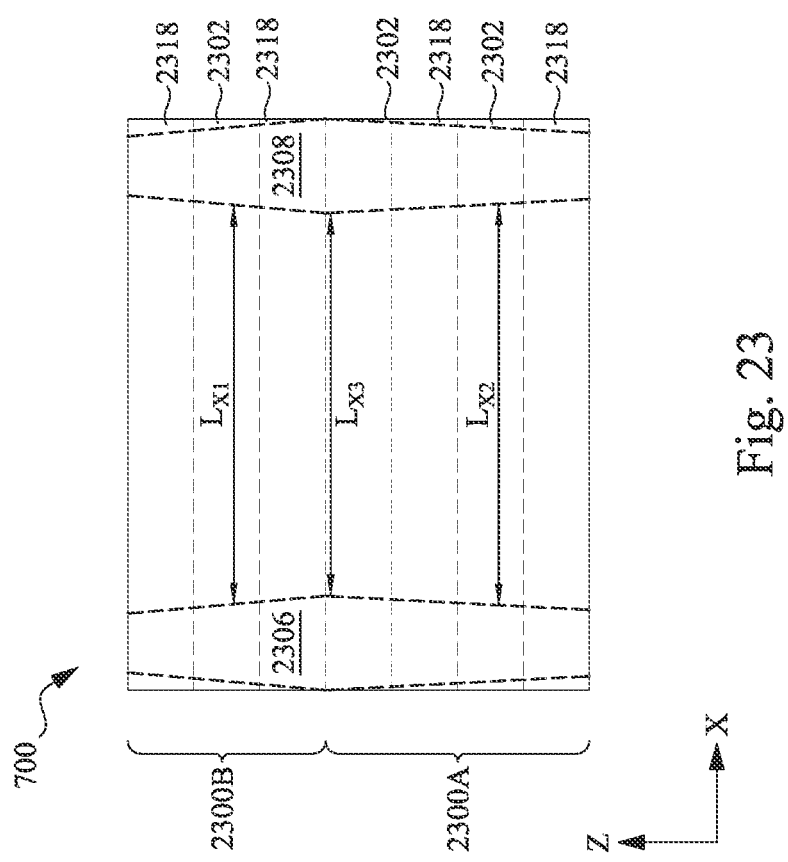
FIG. 23 illustrates a cross-sectional view cut along a first lateral cross-section (e.g., along the X-direction) of an example semiconductor device, in accordance with some embodiments.

FIG. 23 is a cross-section view of a semiconductor device 700 with a SL 2306 and a BL 2308 that have varying widths that increases in a first portion 2300A and decreases in a second portion 2300B with an increasing height along the vertical direction (e.g., the Z-direction), cut along the X-direction, in accordance with some embodiments.

The semiconductor device 700 is formed from the method 400 from FIG. 4. The semiconductor device 700 is substantially similar to the semiconductor device 500 but with an increasing varying width of the bit lines and the source lines in a first portion and a decreasing varying width of the bit lines and source lines in a second portion along an increasing height of the semiconductor device 700 along the Z-direction. In contrast, the semiconductor device 500 has a continuously increasing varying width of the bit lines and the source lines along an increasing height of the semiconductor device 500.

The semiconductor device 700 comprises the SL 2306, the BL 2308, and a plurality of alternating WLs 2302 and insulating layers 2318 which are substantially similar to the SL 1706, the BL 1708, and the plurality of alternating WLs 902 and insulating layers 118 of the semiconductor device 500 in FIG. 19B, respectively. The dotted lines illustrate that the alternating WLs 2302 and the insulating layers 2318 are in a plane behind the SL 2306 and the BL 2308. For the purposes of clarity, the SL 2306, the BL 2308, and the WLs 2302 are depicted in the same plane. As shown in FIG. 23, the width of the SL 2306 and the BL 2308 increase with an increasing height along the first portion 2300A. The width of the SL 2306 and BL 2308 decrease with an increasing height along the second portion 2300B. The varying width of the SL 2306 and the BL 2308 result in a varying channel length. For example, the topmost channel length is $Lx_1$, the bottommost channel length is $Lx_2$, and the channel length at the point where the first portion 2300A meets the second portion 2300B is $Lx_3$. In some embodiments, the channel length $Lx_3$ is less than the channel lengths $Lx_1$ and $Lx_2$. In some embodiments, the channel length $Lx_1$ is equal to the channel length $Lx_2$. In some embodiments, the channel lengths between the bottommost channel length $Lx_2$ and the channel length $Lx_3$ decrease in length in an increasing height along the Z-direction. In some embodiments, the channel length $Lx_3$ and the topmost channel length $Lx_1$ increase in length in an increasing height along the Z-direction.

The semiconductor device 700 further comprises memory layers and semiconductor channels corresponding to SL 2306 and the BL 2308 (not shown). The memory layers and the semiconductor channels of the semiconductor device 700 are substantially similar to the memory layers 1002-1022 and 1402-1412 and the semiconductor channels 1102A-1122F and 1502A-1512F, respectively, in the semiconductor device 500.

In some embodiments, the voltage level of read bias applied to the WLs 2302 decreases along the first portion 2300A and decreases along the second portion 2300B with an increasing height in the Z-direction. The voltage level of read bias applied to the WLs 2302 may be proportional to the channel length. For example, the topmost WL 2302 corresponding to the channel length $Lx_1$ may have a first level of read bias applied. The bottommost WL 2302 corresponding to the channel length $Lx_2$ has may have a second level of read bias applied. The WL 2302 at the point where the first portion 2300A meets the second portion 2300B (sometimes referred to as a middle one of the plurality of third conductive structures) corresponding to the channel length $Lx_3$ may have a third level of read bias applied. In some embodiments, the third level of read bias applied may be less than the first and second level of read biases. In some embodiments, the first level of read bias is equal to the second level of read bias. The varying read biases of the WL 2302 are designed to make cell current increase or remain constant with varying channel lengths. In some embodiments, the plurality of memory cells in a memory string conduct a current with a constant level. It is understood that the semiconductor device 700 is not limited to the three WL 2302 shown in FIG. 23, and that the middle one of the plurality of third conductive structures can refer to any WL 2302 between the topmost WL 2302 and the bottommost WL 2302.

Figure 24A:
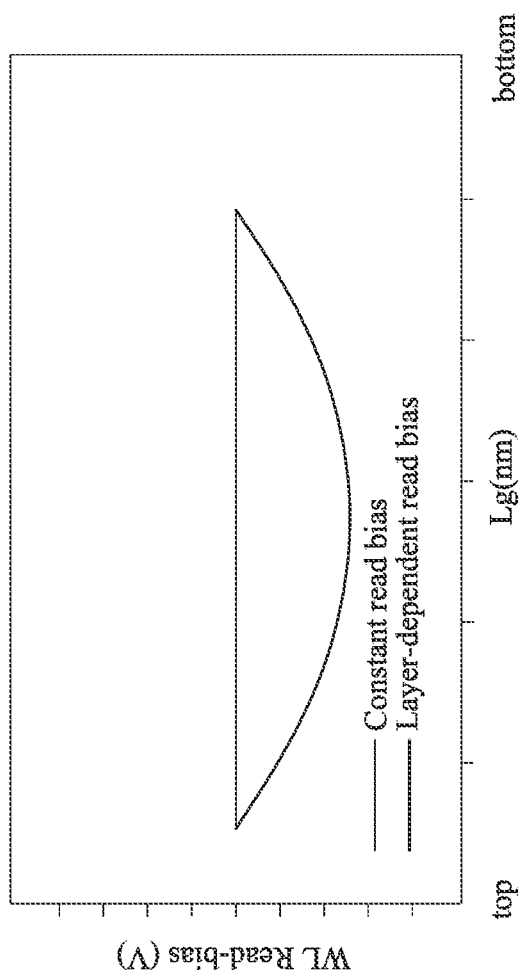
FIGS. 24A-B are plots of word line bias versus a channel length and a cell current versus channel length, respectively, of the example semiconductor device of FIG. 23, in accordance with some embodiments.
Figure 24B:
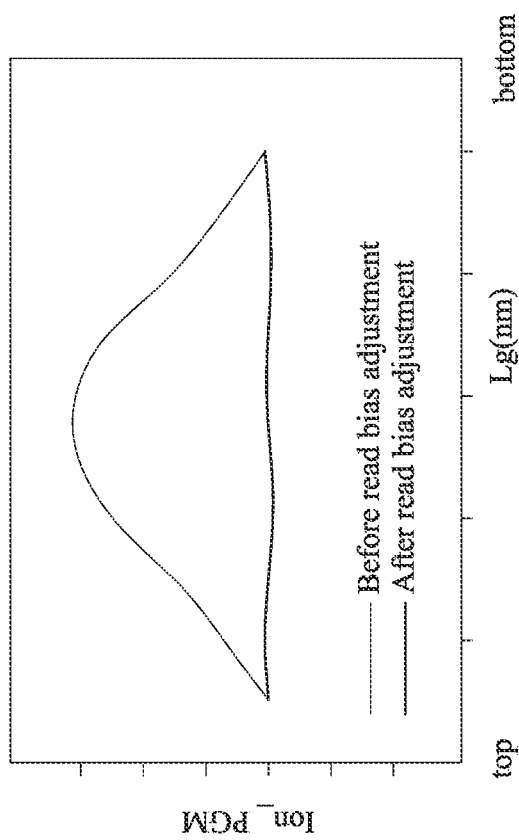

FIGS. 24A-B illustrate plots of WL read bias and cell current, respectively, along the vertical axes that correspond to the embodiment of the semiconductor device 700 shown in FIG. 23. The horizontal axes of FIGS. 24A-B are channel length of the semiconductor device 700 from the top of the device to the bottom.

In the semiconductor device 700, the channel length decreases from the bottom along a first portion and increases along a second portion to the top. FIG. 24A illustrates that the WL read bias shown on the vertical axis directly corresponds to the channel length for this embodiment, in comparison to a constant WL read bias applied. FIG. 24B demonstrates that the WL read bias results in a constant cell current shown on the vertical axis, in comparison to the degradation of cell current typically observed along longer channel lengths. In is shown in FIG. 24B that increasing the WL read bias with an increasing channel length results in the desired cell current.

Figure 25A:
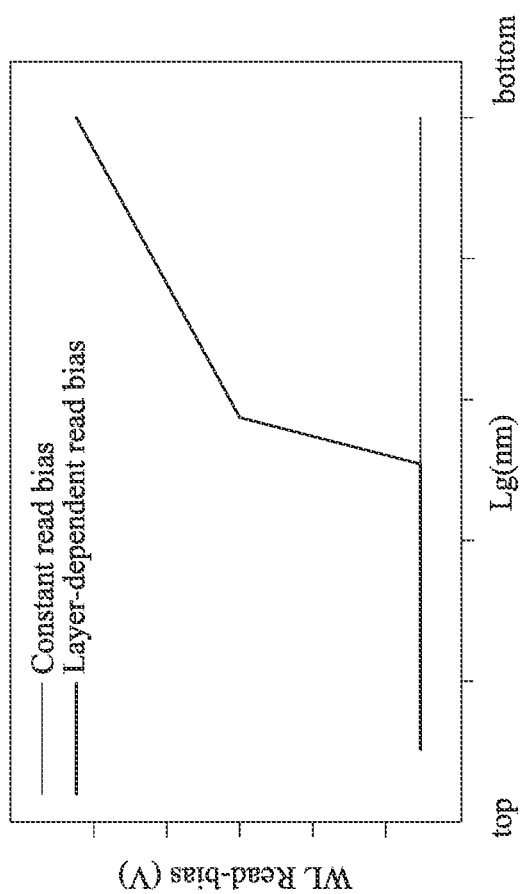
FIGS. 25A, 25B, 26A, 26B, 27A, and 27B are plots of word line bias versus channel length and a cell current versus channel length of example semiconductor devices, in accordance with some embodiments.
Figure 25B:
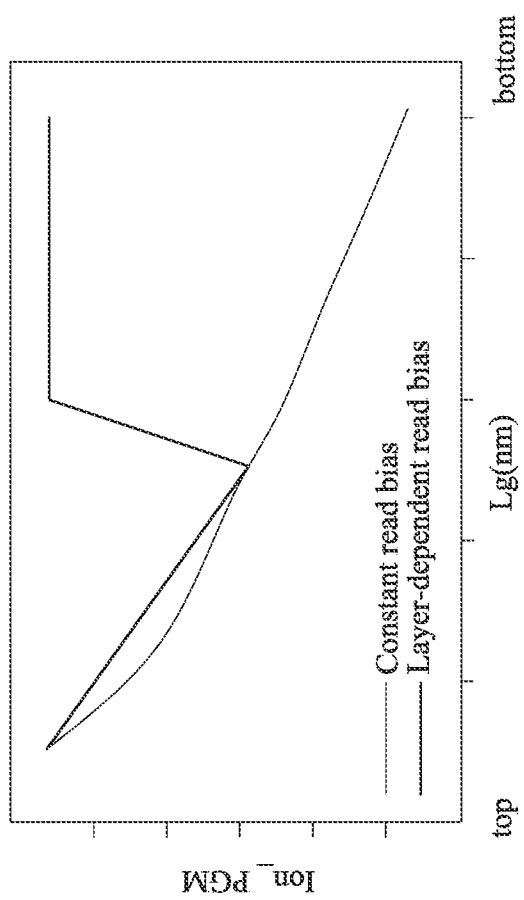
Figure 26A:
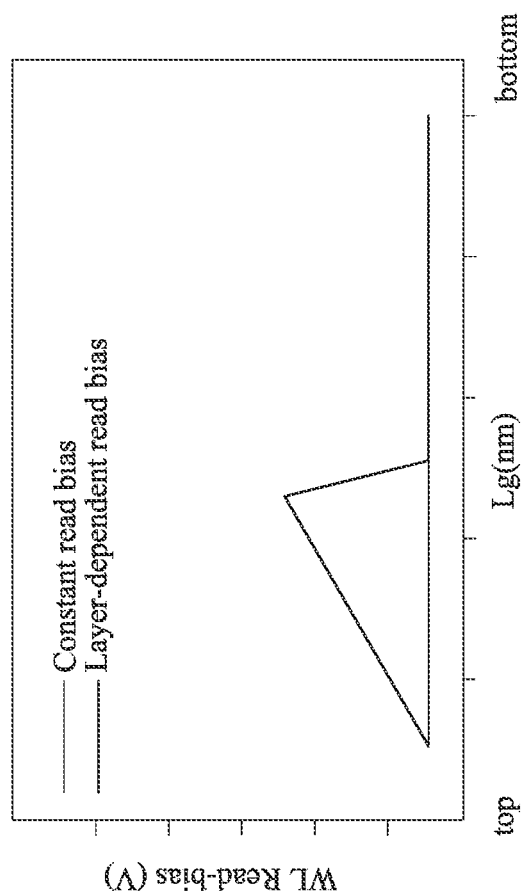
Figure 26B:
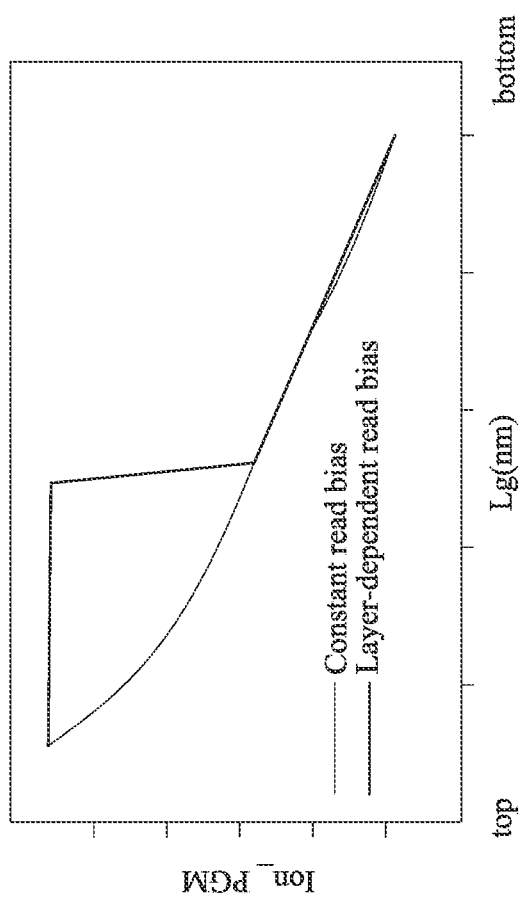
Figure 27A:
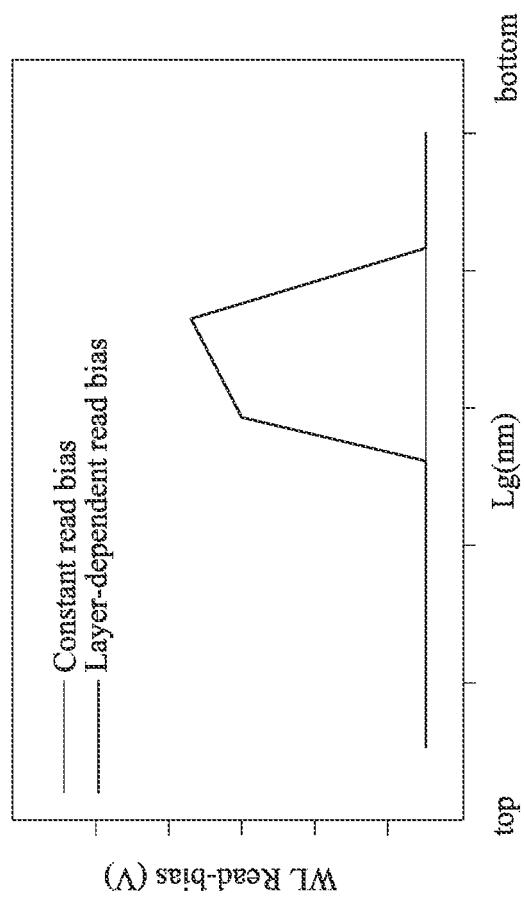
Figure 27B:
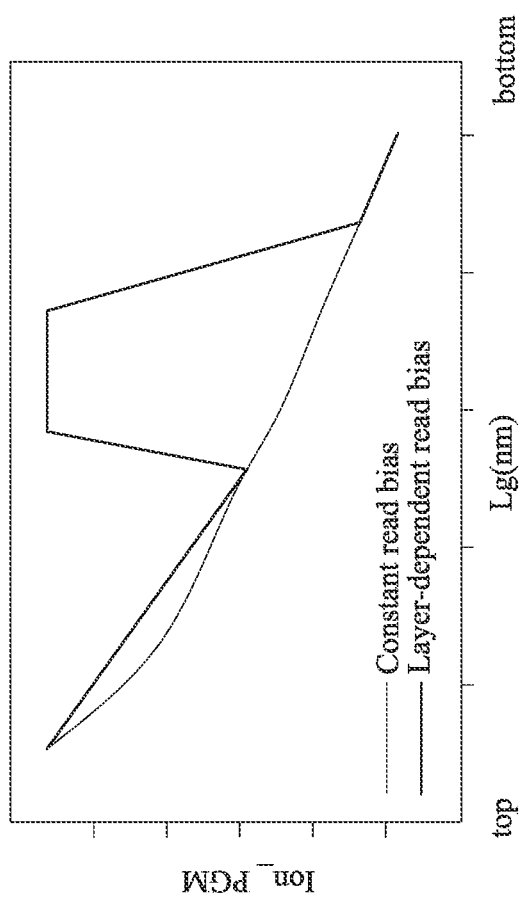

FIGS. 25A-27B illustrate various plots of varying the levels of word line bias to correspond to channel length and the effect on cell current. Therefore, the present invention is not limited to the embodiments discussed above. FIGS. 25A, 26A, and 27A are plots of word line bias as a result of channel length. FIGS. 25B, 26B, and 27B are plots of the cell current as versus channel length as a result of varying WL read bias that correspond to FIGS. 25A, 26A, and 27A, respectively.

In FIGS. 25A-B, the WL read bias is constant along a first portion of a semiconductor device from the topmost word line to a middle word line and increases linearly with two different slopes along a second portion of the semiconductor device from the middle word line to a bottommost word line. FIG. 25B shows the resulting cell current along the vertical axis of the semiconductor device. When the WL read bias is constant along an increasing channel length, the cell current decreases. When an increasing WL read bias is added along increasing channel lengths, the cell current will increase. When a larger amount of WL read bias is added along channel lengths, the cell current is constant.

In FIGS. 26A-B, the WL read bias increases along a first portion of a semiconductor device from the topmost word line to a middle word line, decreases, and then remains constant until the bottommost word line as shown in FIG. 26A. FIG. 26B shows the resulting cell current along the vertical axis. As WL read bias increases along an increasing channel length, the cell current stays constant. When a constant WL read bias is present, the cell current decreases.

In FIGS. 27A-B, the WL read bias stays constant along a first portion of a semiconductor device from the topmost word line to a middle word line, increases, and then decrease until the bottommost word line as shown in FIG. 27A. FIG. 27B shows the resulting cell current along the vertical axis. When the WL read bias remains constant along an increasing channel length, the cell current will degrade. An increasing WL read bias results in a constant cell current along the semiconductor device.

FIGS. 25A-27B further demonstrate that modifying the word line bias to correspond to the channel length compensates for the loss of cell current typically seen in semiconductor devices. Furthermore, the word line bias does not need to increase or decrease continuously throughout the semiconductor device and can be modified according to the desired outcome. In a semiconductor device that has an increasing channel length from the topmost word line to the bottommost word line, cell current would typically degrade from the topmost word line to the bottommost word line. FIGS. 25A-27B demonstrate that a constant WL read bias leads to a decreasing cell current, an increasing WL read bias leads to an increasing or constant cell current, and a decreasing WL read bias leads to a decreasing cell current.

In one aspect of the present disclosure, a semiconductor device is disclosed. The semiconductor device comprises a first conductive structure extending along a vertical direction and a second conductive structure extending along the vertical direction. The second conductive structure is spaced apart from the first conductive structure is spaced apart from the first conductive structure along a lateral direction. The semiconductor device further comprises a plurality of third conductive structures each extending along the lateral direction. The plurality of third conductive structures are disposed across the first and second conductive structures. The first and second conductive structures each have a varying width along the lateral direction. The plurality of third conductive structures are configured to be applied with respective different voltages in accordance with the varying width of the first and second conductive structures.

In another aspect of the present disclosure, a memory device is disclosed. The memory device comprises a controller and a memory array operatively coupled to the controller. The memory array comprises a first bit/source line extending along a vertical direction, a second bit/source line extending along the vertical direction, and a plurality of first word lines each extending along a first lateral direction. The memory array further comprises a first memory film extending along the vertical direction. The first memory film is in contact with the plurality of first word lines. The memory array further comprises a first semiconductor channel extending along the vertical direction. The first semiconductor channel is in contact with the first and second bit/source lines and with the first memory film on respective sides. The first and second bit/source lines each have a width extending along the first lateral direction, and the width increases in accordance with an increasing height of the first and second bit/source lines. The controller is configured to provide respective different voltages to the plurality of first word lines. The different voltages decrease from a bottommost one of the plurality of first word lines to a topmost one of the plurality of first word lines.

In yet another aspect of the present disclosure, a method for operating a memory device is disclosed. The method comprises providing a plurality of memory cells vertically arranged on top of one another. The plurality of memory cells share a vertically extending bit line and a vertically extending source line but are gated by a plurality of word lines, respectively. The bit line and the source line are separated from each other along a lateral direction. The plurality of word lines each extend along the lateral direction. The method further comprises adjusting voltages applied to the plurality of word lines in accordance with a varying width of each of the bit line source line. The varying width extends along the lateral direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first conductive structure extending along a vertical direction;
a second conductive structure extending along the vertical direction, wherein the second conductive structure is spaced apart from the first conductive structure along a lateral direction; and
a plurality of third conductive structures each extending along the lateral direction, wherein the plurality of third conductive structures are disposed across the first and second conductive structures;
wherein the first and second conductive structures each have a width extending in the lateral direction and varying along the vertical direction; and
wherein the plurality of third conductive structures are configured to be applied with respective different voltages in accordance with the varying width of the first and second conductive structures.

2. The semiconductor device of claim 1, further comprising:
a semiconductor channel extending along the vertical direction and in contact with the first and second conductive structures; and
a memory film extending along the vertical direction and interposed between the semiconductor channel and the plurality of third conductive structures.

3. The semiconductor device of claim 2, wherein the memory film includes a ferroelectric layer.

4. The semiconductor device of claim 2, wherein the first conductive structure and the second conductive structure are in contact with end portions of a sidewall of the semiconductor channel, respectively.

5. The semiconductor device of claim 2, wherein each of the plurality of third conductive structures, the first conductive structure, the second conductive structure, a portion of the semiconductor channel, and a portion of the memory film collectively operate as one of a plurality of memory cells of a memory string.

6. The semiconductor device of claim 5, wherein the plurality of memory cells conduct a current with a constant level.

7. The semiconductor device of claim 1, wherein the varying width increases with an increasing height of the first and second conductive structures, while the voltages applied to the plurality of third conductive structures decrease from a bottommost one of the plurality of third conductive structures to a topmost one of the plurality of third conductive structures.

8. The semiconductor device of claim 1, wherein the varying width having a first portion increases and a second portion decreases, with an increasing height of the first and second conductive structures, while the voltages applied to the plurality of third conductive structures decrease from a bottommost one of the plurality of third conductive structures to a middle one of the plurality of third conductive structures and increase from the middle third conductive structure to a topmost one of the plurality of third conductive structures.

9. The semiconductor device of claim 1, wherein the varying width having a first portion decreases and a second portion increases, with an increasing height of the first and second conductive structures, while the voltages applied to the plurality of third conductive structures increase from a bottommost one of the plurality of third conductive structures to a middle one of the plurality of third conductive structures and decrease from the middle third conductive structure to a topmost one of the plurality of third conductive structures.

10. A memory device, comprising:
a controller; and
a memory array operatively coupled to the controller, comprising:
a first bit/source line extending along a vertical direction;
a second bit/source line extending along the vertical direction; and
a plurality of first word lines each extending along a first lateral direction;
wherein the first and second bit/source lines each have a width extending along the first lateral direction, the width increasing in accordance with an increasing height of the first and second bit/source lines; and
wherein the controller is configured to provide respective different voltages to the plurality of first word lines, the voltages decreasing from a bottommost one of the plurality of first word lines to a topmost one of the plurality of first word lines.

11. The memory device of claim 10, wherein the memory array further comprises:
a first memory film extending along the vertical direction, the first memory film in contact with the plurality of first word lines; and
a first semiconductor channel extending along the vertical direction, the first semiconductor channel in contact with the first and second bit/source lines and with the first memory film on respective sides;
wherein the first bit/source line, the second bit/source line, one of the first word lines, a portion of the first semiconductor channel, and a portion of the first memory film collectively operate as one of a plurality of first memory cells.

12. The memory device of claim 11, wherein the plurality of first memory cells conduct a current with a constant level.

13. The memory device of claim 11, wherein the memory array further comprises:
a plurality of second word line extending along the first lateral direction, the second word lines disposed opposite the first and second bit/source lines from the first word lines along a second lateral direction perpendicular to the first lateral direction;
a second memory film extending along the vertical direction, the second memory film in contact with the plurality of second word lines; and
a second semiconductor channel extending along the vertical direction, the second semiconductor channel in contact with the first and second bit/source lines and with the second memory film on respective sides;
wherein the controller is configured to also provide respective different voltages to the plurality of second word lines, the voltages decreasing from a bottommost one of the plurality of second word lines to a topmost one of the plurality of second word lines.

14. The memory device of claim 13, wherein the first bit/source line, the second bit/source line, one of the second word lines, a portion of the second semiconductor channel, and a portion of the second memory film collectively operate as one of a plurality of second memory cells.

15. The memory device of claim 14, wherein the plurality of second memory cells conduct a current with a constant level.

16. The memory device of claim 13, wherein the plurality of first word lines are separated from one another along the vertical direction, and the plurality of second word lines are separated from one another along the vertical direction.

17. The memory device of claim 13, wherein each of the first memory film and the second memory film includes a ferroelectric layer.

18. A method for operating a memory device, comprising:
providing a plurality of memory cells vertically arranged on top of one another, wherein the plurality of memory cells share a vertically extending bit line and a vertically extending source line, but are gated by a plurality of word lines, respectively, and wherein the bit line and source line are separated from each other along a lateral direction, and the plurality of word lines each extend along the lateral direction; and
adjusting voltages applied to the plurality of word lines in accordance with a varying width of each of the bit line and source line, wherein the width extends along the lateral direction.

19. The method of claim 18, in response to determining that the varying width increases with an increasing height of the bit line and source line, the method comprising:
decreasing the voltages from a bottommost one of the plurality of word lines to a topmost one of the plurality of word lines.

20. The method of claim 18, wherein each of the plurality of memory cells has a respective portion of a vertically extending ferroelectric layer.

* * * * *